United States Patent
Lee et al.

(10) Patent No.: US 7,405,168 B2
(45) Date of Patent: Jul. 29, 2008

(54) PLURAL TREATMENT STEP PROCESS FOR TREATING DIELECTRIC FILMS

(75) Inventors: Eric M. Lee, Austin, TX (US); Dorel I. Toma, Dripping Springs, TX (US)

(73) Assignee: Tokyo Electron Limited, Tokyo (JP)

( * ) Notice: Subject to any disclaimer, the term of this patent is extended or adjusted under 35 U.S.C. 154(b) by 169 days.

(21) Appl. No.: 11/239,291

(22) Filed: Sep. 30, 2005

(65) Prior Publication Data
US 2007/0077781 A1    Apr. 5, 2007

(51) Int. Cl.
*H01L 21/31* (2006.01)
*H01L 21/469* (2006.01)
(52) U.S. Cl. ............... 438/781; 438/780; 257/E21.241; 257/E21.242
(58) Field of Classification Search ................. 438/780, 438/781
See application file for complete search history.

(56) References Cited

U.S. PATENT DOCUMENTS
6,576,300 B1 * 6/2003 Berry et al. ................. 427/489

FOREIGN PATENT DOCUMENTS
JP          2004-343017      12/2004
WO          WO 02/01621   *  1/2002

* cited by examiner

*Primary Examiner*—Alexander G Ghyka
(74) *Attorney, Agent, or Firm*—Oblon, Spivak, McClelland, Maier & Neustadt, P.C.

(57) ABSTRACT

A method and computer readable medium for treating a dielectric film on one or more substrates includes disposing the one or more substrates in a process chamber configured to perform plural treatment processes on a dielectric film. The dielectric film is formed on at least one of said one or more substrates, wherein the dielectric film includes an initial dielectric constant having a value less than the dielectric constant of $SiO_2$. A thermal treatment process that includes annealing the one or more substrates is performed in order to remove volatile constituents from the dielectric film on the one or more substrates and a chemical treatment process is performed on the one or more substrates, including: introducing a treating compound to the dielectric film on the one or more substrates, and heating the one or more substrates.

48 Claims, 13 Drawing Sheets

(1) $(CH_3)_3Si-NH-Si(CH_3)_3 + HO-Si\equiv_{(s)} \rightarrow (CH_3)_3—Si—O—Si\equiv_{(s)}$ (2) $(CH_3)_3-SiNH_{2(g)} + (HO-Si)\equiv_{(s)} \rightarrow (CH_3)_3—Si—O—Si\equiv_{(s)} + NH_{2(g)}$

PLURAL TREATMENT STEP PROCESS FOR TREATING DIELECTRIC FILMS

CROSS-REFERENCE TO RELATED APPLICATIONS

This application is related to co-pending U.S. patent application Ser. No. 10/682,196, entitled "Method and system for treating a dielectric film", filed on Oct. 10, 2003; co-pending U.S. patent application Ser. No. 11/060,352, entitled "Method and system for treating a dielectric film", filed on Feb. 18, 2005; and co-pending U.S. patent application Ser. No. 11/239,294, entitled "Treatment of low dielectric constant films using batch processing system", filed on even date herewith; and co-pending U.S. patent application Ser. No. 11/239,306, entitled "Plasma-assisted vapor phase treatment of low dielectric constant films using a batch processing system", filed on even date herewith; the contents of which are incorporated by reference in their entirety.

BACKGROUND OF THE INVENTION

1. Field of the Invention

The present invention relates to a method and system for treating a dielectric film and, more particularly, to a plural treatment step method and system of treating a substrate having a dielectric film in order to dry the dielectric film and perform at least one of healing or sealing the dielectric film.

2. Description of Related Art

As is known to those in the semiconductor art, interconnect delay is a major limiting factor in the drive to improve the speed and performance of integrated circuits (IC). One way to minimize interconnect delay is to reduce interconnect capacitance by using low dielectric constant (low-k) materials during production of the IC. Thus, in recent years, low-k materials have been developed to replace relatively high dielectric constant insulating materials, such as silicon dioxide. In particular, low-k films are being utilized for inter-level and intra-level dielectric layers between metal layers of semiconductor devices. Additionally, in order to further reduce the dielectric constant of insulating materials, material films are formed with pores, i.e., porous low-k dielectric films. Such low-k films can be deposited by a spin-on dielectric (SOD) method similar to the application of photo-resist, or by chemical vapor deposition (CVD). Thus, the use of low-k materials is readily adaptable to existing semiconductor manufacturing processes.

While low-k materials are promising for fabrication of semiconductor circuits, the present inventors have recognized that these films also provide many challenges. First, low-k films tend to be less robust than more traditional dielectric layers and can be damaged during wafer processing, such as by etch and plasma ashing processes generally used in patterning the dielectric layer. Further, some low-k films tend to be highly reactive when damaged, particularly after patterning, thereby allowing the low-k material to absorb water and/or react with other vapors and/or process contaminants that can alter the electrical properties of the dielectric layer.

Moreover, the present inventors have recognized that the porosity of some low-k dielectric films often exacerbates the problems of integrating metallization with the dielectric. In general, the integration of copper metallization with low-k dielectric films requires the use of a damascene structure, wherein metal wiring patterns are formed within the dielectric film prior to copper deposition. In order to minimize the diffusion of copper into the dielectric film, a barrier layer is typically formed on the internal surfaces of these patterns following pattern etching. However, exposure of the pores and/or damage of the low-k film following the etching of patterns in the dielectric film causes problems with diffusion of the barrier material and copper through imperfections in the barrier film local to these exposed pores, as well as poor adhesion of the barrier layer to the dielectric film.

Additionally, porous low-k dielectric films, such as the damaged low-k films noted above, are susceptible to absorbing moisture, and other contaminants. For example, following pattern etching, the exposed surfaces can change from being hydrophobic to becoming hydrophilic, the exposed surface layer can become depleted of carbon (C), and the pores can retain contaminants from the etch process.

SUMMARY OF THE INVENTION

One aspect of the present invention is to reduce or eliminate any of the above-described problems or other problems in the prior art relating to processing dielectric films.

Another aspect of the present invention is to treat a dielectric film with a plural treatment step process in order to dry the dielectric film, and heal and/or seal the dielectric film.

Yet another aspect of the present invention is to treat a dielectric film with a plural treatment step process in order to reduce diffusion of barrier material into the dielectric film and/or improve adhesion of the barrier film to the dielectric film.

Any of these and/or other aspects may be provided by a method and computer readable medium for treating a dielectric film in accordance with the present invention. In one embodiment, the method of and computer readable medium for treating a dielectric film on one or more substrates comprises: disposing the one or more substrates in a process chamber configured to perform plural treatment processes on a dielectric film formed on at least one of said one or more substrates, wherein the dielectric film comprises an initial dielectric constant having a value less than the dielectric constant of $SiO_2$; performing a thermal treatment process that includes annealing the one or more substrates in order to remove volatile constituents from the dielectric film on the one or more substrates; and performing a chemical treatment process on the one or more substrates, comprising: introducing a treating compound to the dielectric film on the one or more substrates, and heating the one or more substrates.

DETAILED DESCRIPTION OF EXEMPLARY EMBODIMENTS

In the following description, in order to facilitate a thorough understanding of the invention and for purposes of explanation and not limitation, specific details are set forth, such as a particular geometry of the processing system and descriptions of various components. However, it should be understood that the invention may be practiced in other embodiments that depart from these specific details.

Figure 1A:
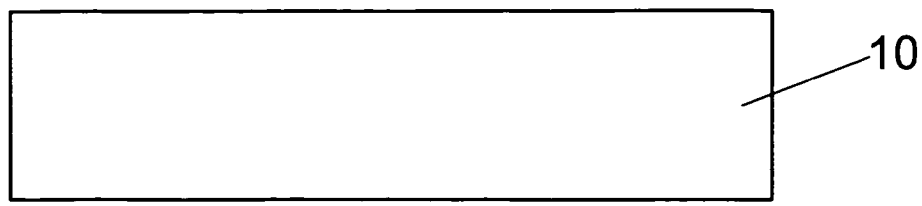
FIGS. 1A through 1E present a simplified schematic representation of a method of forming and treating a dielectric film in accordance with an embodiment of the present invention.
Figure 1B:
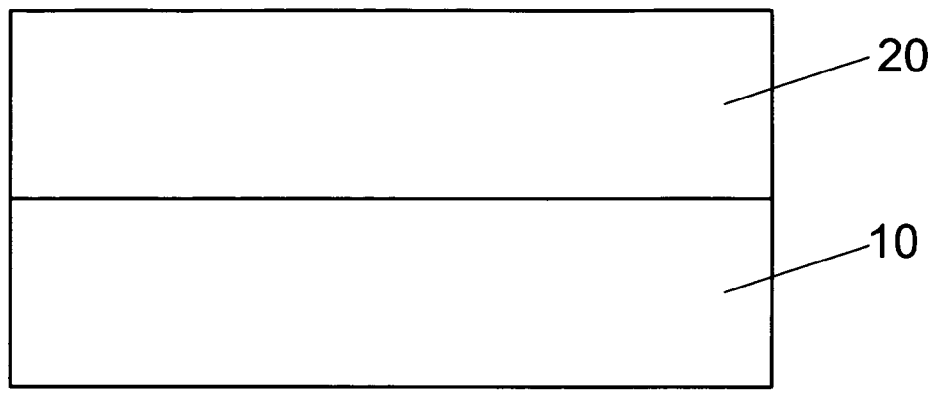

Referring now to the drawings, wherein like reference numerals designate identical or corresponding parts throughout the several views, FIGS. 1A through 1E present a schematic representation of a method of forming a pattern in a dielectric film and treating the exposed surfaces of the etched pattern in the dielectric film in order to perform at least one of drying, healing, sealing, or cleaning these surfaces. Additionally, FIG. 2 presents a flow chart 100 of performing the method according to an embodiment of the present invention. As shown in FIGS. 1A, 1B, and 2, a dielectric film 20 is formed in step 110 on an upper surface of a substrate 10 that may or may not include additional layers. The substrate 10 may be a semiconductor, a metallic conductor, or any other substrate to which the dielectric film is to be formed upon. The dielectric film has a nominal dielectric constant value less than the dielectric constant of $SiO_2$, which is approximately 4 (e.g., the dielectric constant for thermal silicon dioxide can range from 3.8 to 3.9). In the embodiments of the invention, the dielectric film 20 may have a dielectric constant of less than 3.0, or a dielectric constant ranging from 1.6 to 2.7.

The dielectric film 20 can be formed using chemical vapor deposition (CVD) techniques, or spin-on dielectric (SOD) techniques such as those offered in the Clean Track ACT 8 SOD and ACT 12 SOD coating systems commercially available from Tokyo Electron Limited (TEL). The Clean Track ACT 8 (200 mm) and ACT 12 (300 mm) coating systems provide coat, bake, and cure tools for SOD materials. The track system can be configured for processing substrate sizes of 100 mm, 200 mm, 300 mm, and greater. Other systems and methods for forming a dielectric film on a substrate are well known to those skilled in the art of both spin-on dielectric technology and CVD dielectric technology.

The dielectric film 20 can, for example, be characterized as a low dielectric constant (or low-k) dielectric film. The dielectric film 20 may include at least one of an organic, inorganic, and inorganic-organic hybrid material. Additionally, the dielectric film 20 may be porous or non-porous. For example, the dielectric film may include an inorganic, silicate-based material, such as oxidized organosilane (or organo siloxane), deposited using CVD techniques. Examples of such films include Black Diamond™ CVD organosilicate glass (OSG) films commercially available from Applied Materials, Inc., or Coral™ CVD films commercially available from Novellus Systems. Additionally, for example, porous dielectric films can include single-phase materials, such as a silicon oxide-based matrix having $CH_3$ bonds that are broken during a curing process to create small voids (or pores). Additionally, for example, porous dielectric films can include dual-phase materials, such as a silicon oxide-based matrix having pores of organic material (e.g., porogen) that is evaporated during a curing process. Alternatively, the dielectric film 20 may include an inorganic, silicate-based material, such as hydrogen silsesquioxane (HSQ) or methyl silsesquioxane (MSQ), deposited using SOD techniques. Examples of such films include FOx HSQ commercially available from Dow Corning, XLK porous HSQ commercially available from Dow Corning, and JSR LKD-5109 commercially available from JSR Microelectronics. Still alternatively, the dielectric film 20 can include an organic material deposited using SOD techniques. Examples of such films include SiLK-I, SiLK-J, SiLK-H, SiLK-D, and porous SiLK semiconductor dielectric resins commercially available from Dow Chemical, and FLARE™, and Nano-glass commercially available from Honeywell.

Figure 1C:
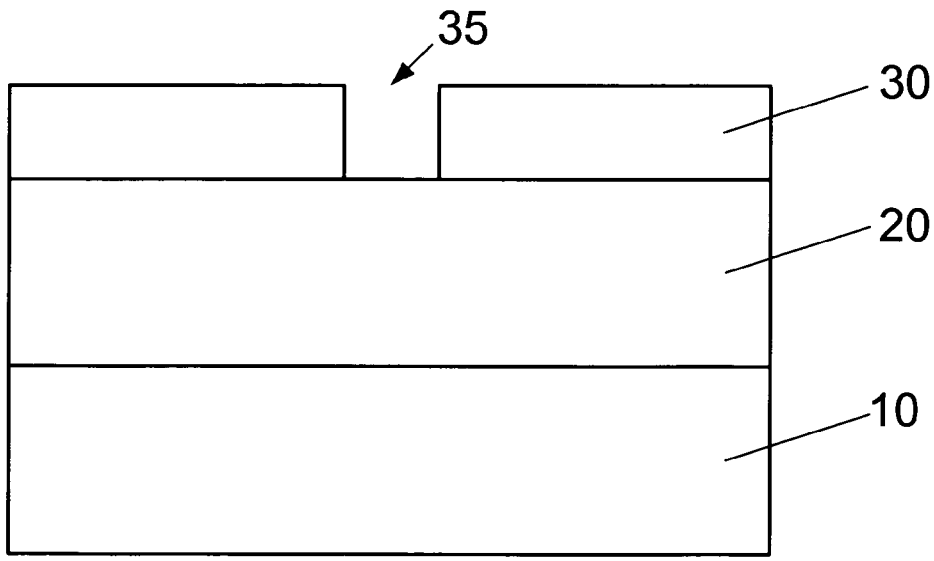
Figure 2:
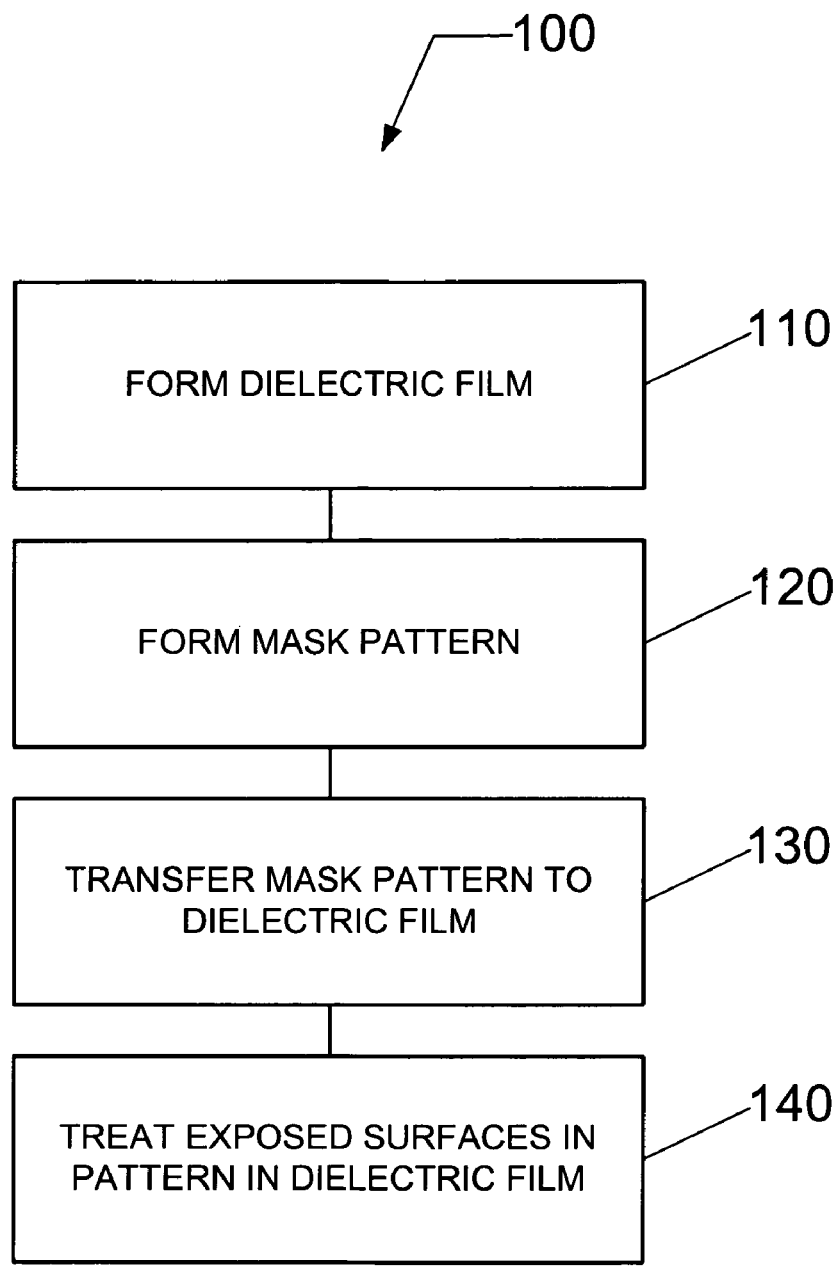
FIG. 2 presents a flow chart of a method of producing a dielectric film according to an embodiment of the present invention.

Once the dielectric film 20 is prepared, a patterned mask 30 is formed in step 120 on an upper surface thereof as illustrated in FIG. 1C. The patterned mask 30 can include a pattern 35 formed in a layer of light-sensitive material, such as photoresist, using micro-lithography, followed by the removal of the irradiated regions of the light-sensitive material (as in the case of positive photoresist), or non-irradiated regions (as in the case of negative resist) using a developing solvent. Alternatively, the mask 30 can include a bilayer mask, or multi-layer mask, having an anti-reflective coating (ARC), such as a buried ARC (BARC) layer, a sacrificial DUO™ layer, or a tunable etch resistant ARC (TERA) layer, embedded therein. For example, the mask layer (or layers) can be formed using a track system, or CVD system. The track system can be configured for processing 248 nm resists, 193 nm resists, 157 nm resists, EUV resists, (top/bottom) anti-reflective coatings (TARC/BARC), and top coats. For example, the track system can include a Clean Track ACT 8, or ACT 12 resist coating and developing system commercially available from Tokyo Electron Limited (TEL). Other systems and methods for forming a photoresist film on a substrate are well known to those skilled in the art of spin-on resist technology. Additionally, for example, the mask pattern can be formed using any suitable conventional stepping lithographic system, or scanning lithographic system.

Figure 1D:
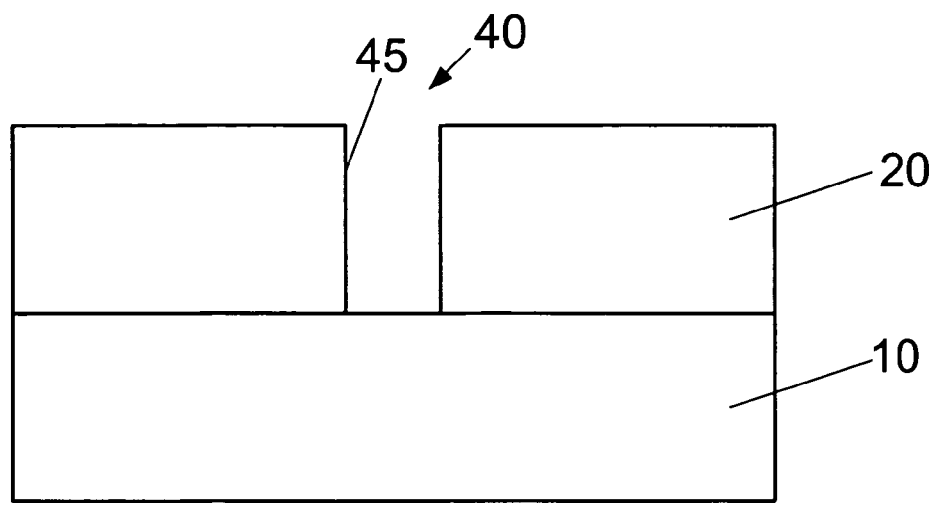

The mask pattern 35 can be transferred to the underlying dielectric film 20 in step 130 to form feature 40 having sidewalls 45 using dry plasma etching as illustrated in FIG. 1D. For instance, when etching oxide dielectric films such as silicon oxide, silicon dioxide, etc., or when etching inorganic low-k dielectric films such as oxidized organosilanes, the etch gas composition generally includes a fluorocarbon-based chemistry ($C_xF_y$, where x and y are integers), such as at least one of $C_4F_8$, $C_5F_8$, $C_3F_6$, $C_4F_6$, $CF_4$, etc., and at least one of an inert gas, oxygen, and CO. Additionally, the etch gas composition may include hydrocarbon or fluorohydrocarbon gases ($C_xH_yF_z$, where x, y, and z are integers), such as $CH_2F_2$ or $CHF_3$. Alternatively, for example, when etching organic low-k dielectric films, the etch gas composition generally includes at least one of a nitrogen-containing gas, and a hydrogen-containing gas. The techniques for selectively etching a dielectric film, such as those described earlier, are well known to those skilled in the art of dielectric etch processes.

During etching, exposed surfaces within the feature 40 formed in the dielectric film 20, such as sidewalls 45, can be damaged, or activated. The damage or activation incurred by these surfaces can lead to the absorption of water, or the adhesion of contaminants and/or chemicals during etch processing (i.e., dry etching, or mask removal during ashing). For example, porous low-k dielectric films can be very susceptible to damage and/or activation during etch processing. In general, porous low-k films are most commonly silicon-oxide based with silanol (Si—OH) groups and/or organo groups. These materials can become activated or damaged due in part to the depletion of an organic component during etch processing. In either case, additional silanol groups are exposed which can readily absorb water, and/or other contaminants. Accordingly, device structures with exposed low-k dielectric layers are difficult to handle and maintain contaminant free, especially after patterning steps. Moreover, activation and/or damage to the bulk of the low-k material can result in an increase to the dielectric constant (k-value). It has been observed that the activated or damaged low-k film can exhibit an increase of the k-value by a value of one or more.

Additionally, when etching porous low-k dielectric films, pores become exposed along sidewalls in the feature formed during etching. The morphology of these small open pores can affect poor film properties, and even cause voids in thin films formed over the porous dielectric film.

In an embodiment of the present invention, the damaged, exposed surfaces (following, for example, an etch or ash process) are treated. The treatment of the dielectric film can comprise cleaning the dielectric film, including cleaning the damaged surfaces of the dielectric film. Additionally, the treatment of the dielectric film can comprise drying the dielectric film. Further, the treatment of the dielectric film can comprise healing the dielectric film, whereby healing the dielectric film includes restoring or partially restoring the value of the dielectric constant for the dielectric film. Further yet, the treatment of the dielectric film can comprise sealing the dielectric film, whereby exposed surfaces of the dielectric film are sealed.

Figure 1E:
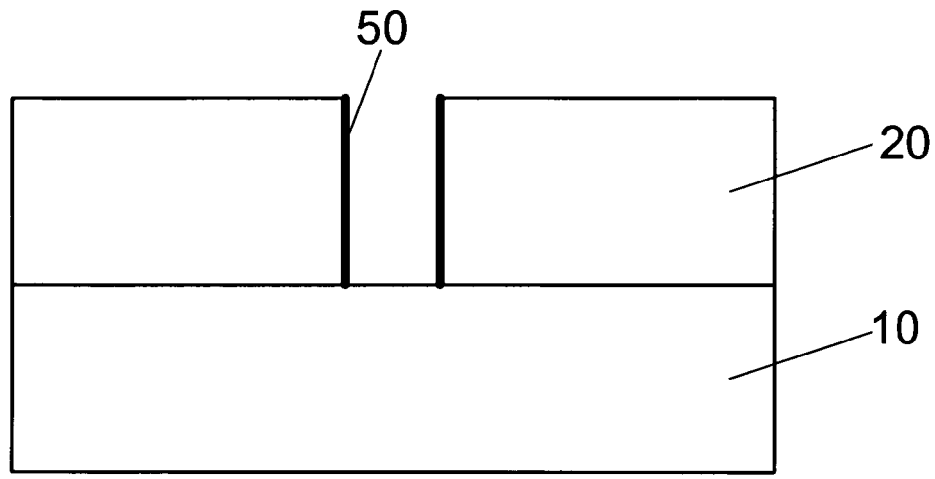

Therefore, according to an embodiment of the present invention, the dielectric film 20 is treated in step 140 in order to perform at least one of cleaning, drying, healing, and sealing of the dielectric film 20. For example, the treatment may be applied to the sidewalls 45 of dielectric film 20, as shown in FIG. 1E, such treatment results in treated sidewalls 50 having improved characteristics.

The cleaning process can include any one or more of removing contaminants or removing residue, etc. The drying process can include removing moisture such as $H_2O$ contamination, and therefore may be considered a cleaning process. Additionally, the healing process can include the rejuvenation of the dielectric film by restoring or partially restoring the value of the dielectric constant. The restoration of the k-value can, for example, be characterized by replenishing carbon depleted sites with carbon-containing material (e.g., $CH_3$). The healing process may also include passivation of the low-k surface using a treating agent that attacks the silanol (Si—OH) groups on the surface to the low-k film to form surface capped silyl groups that passivate the surface. Details of passivating the low-k surface are provided in pending U.S. patent application Ser. No. 10/379,984, entitled "Method of passivating of low dielectric materials in wafer processing", filed Mar. 4, 2003, the entire content of which is incorporated herein by reference. Furthermore, the sealing process can, for example, be characterized by the sealing of exposed pores in exposed surfaces.

During a treating process in accordance with the present invention, the dielectric film 20 is exposed to a treating compound including a $C_xH_y$-containing compound, wherein the subscripts "x" and "y" represent integers greater than or equal to unity. In one embodiment, the treating compound can further include at least one of a nitrogen (N)-containing and a chlorine (Cl)-containing compound in order to assist the surface chemistry on dielectric film 20. For example, the $C_xH_y$-containing component can include at least one of a CH-containing, $CH_2$-containing, and a $CH_3$-containing compound.

Figure 3A:
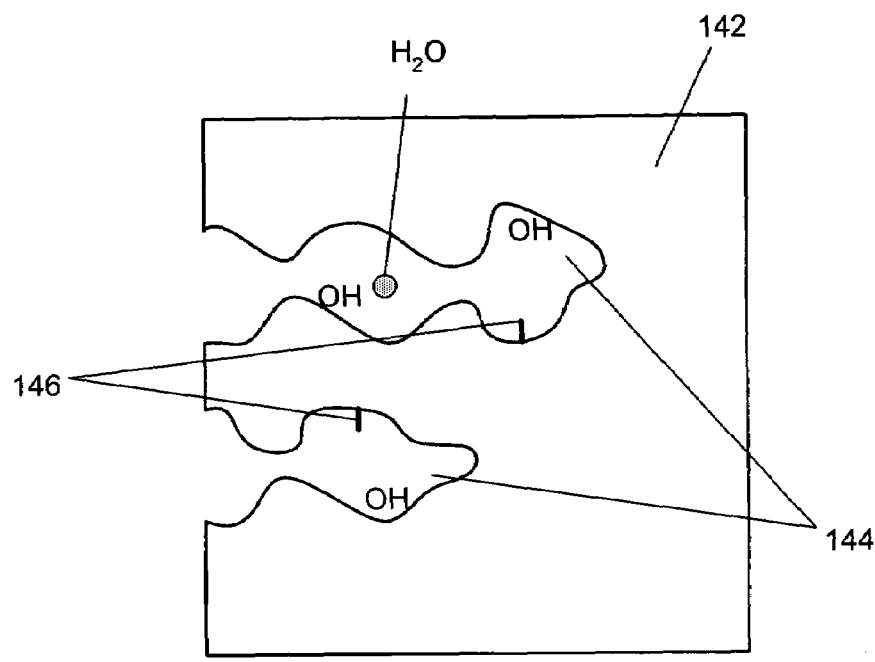
FIGS. 3A and 3B illustrate a schematic representation of a method of treating a dielectric film.
Figure 3B:
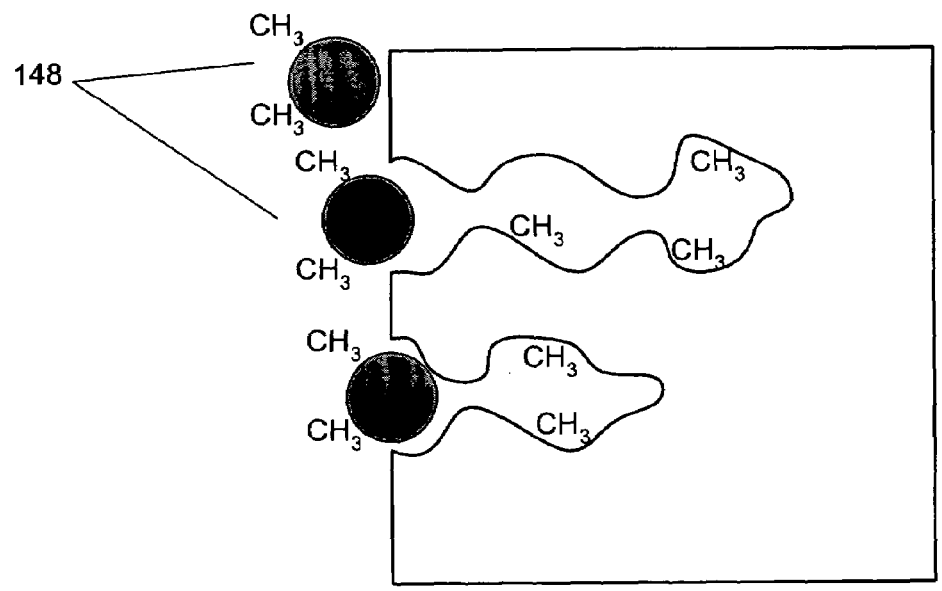

FIGS. 3A and 3B further illustrate an example of a treating process according to an embodiment. In FIG. 3A, a porous low-k dielectric film 142 is shown having pores 144, wherein, following an etching or ashing process, it has been observed that exposed surfaces within these pores become damaged. The surface damage manifests as dangling bonds 146 that can absorb moisture (i.e., $H_2O$) as an OH site. Now referring to FIG. 3B, the dielectric film is exposed to a treating compound including a $C_xH_y$ containing material (e.g., $CH_3$) during which the treating process facilitates cleaning pores 144 to remove OH and other residue, healing the exposed surfaces of the pores by replacing the OH and dangling bonds 146 with $C_xH_y$ (e.g., $CH_3$), and sealing pores 144 by the adhesion of $C_xH_y$ (e.g., $CH_3$) containing molecules 148 onto the dielectric film 142 to close the exposed pores 144. The treatment process may also dry the film by removing $H_2O$ molecules that have no bonded as OH sites. Thus, the treated low-k film includes a surface region having $C_xH_y$ material that provides the low-k film with improved physical properties such as being substantially free from contamination and moisture, having fewer dangling bonds, or having sealed pores in the surface region. Further the $C_xH_y$ material in the surface region provides a dielectric constant lower than corresponding film without the $C_xH_y$ material.

Figure 4A:
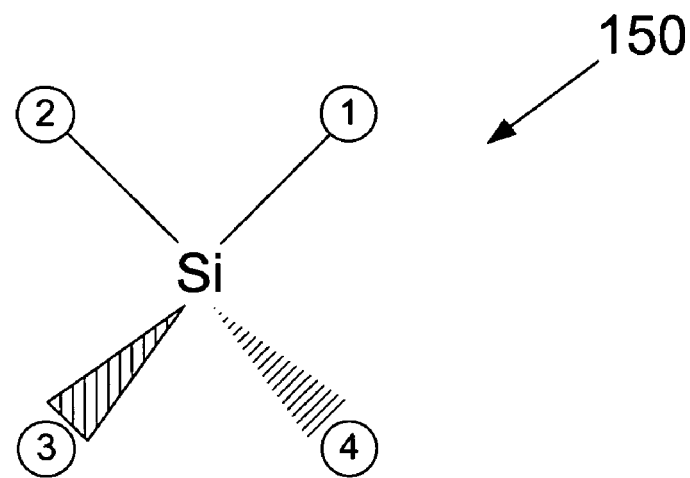
FIGS. 4A through 4C show schematic representations of organosilicon structures used as for treating a dielectric film according to an embodiment of the present invention.

Referring now to FIG. 4A, the treating compound includes a silane structure 150 which can have all organo groups, such as in the case with hexamethyldisilizane (HMDS), or a combination of organo and halide groups (F, Cl, Br, etc.), which are attached to any one of the positions 1 to 4.

Figure 4B:
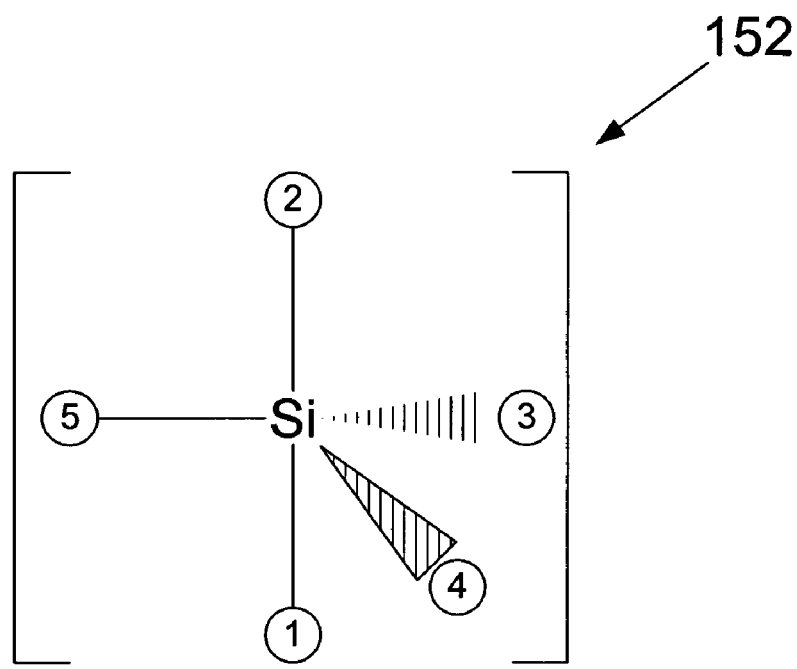

Now referring to FIG. 4B, the treating compound includes a pent-valent organosilicon compound 152, wherein the silicon atom is coordinated to 5 ligands in the positions 1, 2, 3, 4, and 5 in a tiganolbipyramidal configuration. Typically, such compounds 152 are anions with one or more of the positions 1-5 being coordinated with halide atom, such as in the case with a difluorotrimethylilicate anion. When the structure 152 is an anion, the compound 152 also includes a suitable cation, such as sodium, potassium or any other inorganic or organic cation (not shown).

Figures 4C, 4D:
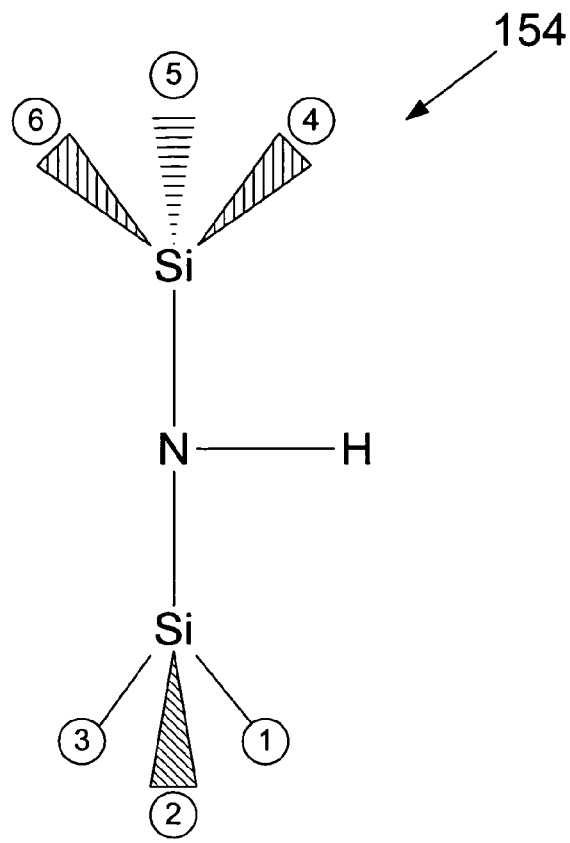
FIG. 4D shows a schematic representation of reactions with a silanol group in a dielectric material according to another embodiment of the present invention.

Now referring to FIG. 4C, the treating compound includes a silazane structure 154, which can be described as an amine structure with two organosilyl groups coordinated to the nitrogen of the amine, such as in the case of hexamethyldisilazane (HMDS).

FIG. 4D shows schematic representations of hexamethyldisilazane (HMDS) reacting with silanol groups on a surface of a dielectric material in reaction sequence (1) and trimethyldisilazane (TMDS) reacting with silanol groups on a surface of the dielectric material in reaction sequence (2). Note that trimethyldisilazane (TMDS) is a product in the reaction sequence (1), which can then further react with silanol groups on a surface of the low-k material in accordance with reaction sequence (2). Hence, hexamethyldisilazane (HMDS) provides is an excellent treating compound for use in accordance with an embodiment of the present invention.

Figure 4E:
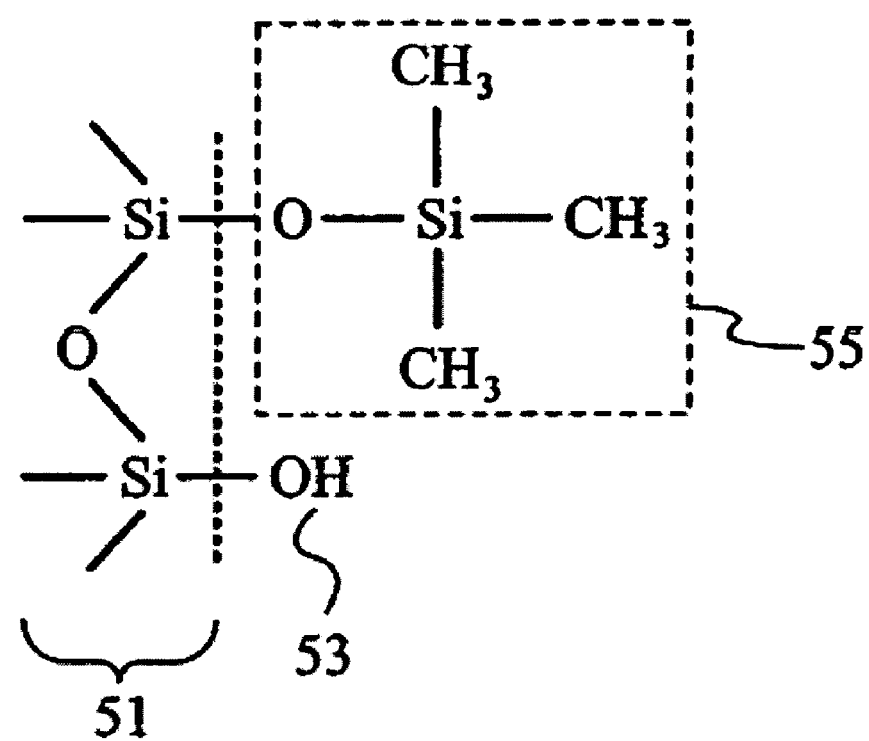
FIG. 4E illustrates steric hindrance between a silanol group and a silyl group on a surface of a dielectric material.

FIG. 4E illustrates steric hindrance between a silanol group 53 and silyl-group 55 on a surface 51 of a dielectric material. Note that the silanol group 53 is extremely large and can actually provide a protective barrier for the silyl-group 55. Accordingly, it is not generally possible to completely silylate an entire surface or bulk of a dielectric material. However, when the dielectric material is pre-treated, it is believed that a greater percent of the silanol groups 53 are replace with silyl-groups 55 on the surface 51.

Alternatively, the treating compound can include at least one of hexamethyldisilazane (HMDS), trimethyidisilazane (TMDS), chlorotrimethylsilane (TMCS), trichloromethylsilane (TCMS), [C$_6$H$_5$Si(CH$_3$)$_2$]$_2$NH (or 1,3-Diphenyl-1,1,3,3-tetramethyldisilazane), C$_{15}$H$_{29}$NSi (or N-tert-Butyl-1,1-dimethyl-1-(2,3,4,5-tetramethyl-2,4-cyclopentadien-1-yl)-silanamine), (CH$_3$)$_2$NH Dimethylamine, H$_2$N(CH$_2$)$_3$Si(OC$_2$H$_5$)$_3$ 3-Aminopropyltriethoxysilane, (CH$_4$SiO)$_4$ (or TMCTS, or tetramethylcyclotetrasiloxane), and [(CH$_3$)$_2$SiO]$_4$ (or OMCTS, or octamethylcyclotetrasiloxane).

In one example, when treating a porous low-k dielectric film with pore sizes less than or equal to 1 nm, the treating compound can include at least one of HMDS, TMDS, and (CH$_3$)$_2$NH Dimethylamine. In a second example, when treating a porous low-k dielectric film with pore sizes greater than or equal to 1 nm, the treating compound can include at least one of [C$_6$H$_5$Si(CH$_3$)$_2$]$_2$NH, C$_{15}$H$_{29}$NSi, and H$_2$N(CH$_2$)$_3$Si(OC$_2$H$_5$)$_3$ 3-Aminopropyltriethoxysilane. Alternatively, in a third example, a dielectric film is exposed to a first treating compound, such as at least one of HMDS, TMDS, and (CH$_3$)$_2$NH Dimethylamine, for a first period of time, and exposed to a second treating compound, such as at least one of [C$_6$H$_5$Si(CH$_3$)$_2$]$_2$NH, C$_{15}$H$_{29}$NSi, and H$_2$N(CH$_2$)$_3$Si(OC$_2$H$_5$)$_3$ 3-Aminopropyltriethoxysilane, for a second period of time.

Alternatively, the treating compound can include at least one of an alkyl silane (also including alkoxysilanes), an alkyl siloxane (also including alkoxysiloxanes), an aryl silane, an acyl silane, a cyclo siloxane, a polysilsesquioxane (PSS), an aryl siloxane, an acyl siloxane, or a halo siloxane, or any combination thereof.

The alkyl silane can, for example, comprise:
hexamethyldisilazane (HMDS),
tetramethyidisilazane (TMDS),
trimethylsilyldimethylamine (TMSDMA),
trimethylsilyldiethylamine (TMSDEA),
N-trimethylsilyl-imidazole (TMSI),
methyltrimethoxysilane (MTMOS),
vinyltrimethoxysilane (VTMOS),
trimethylchlorosilane (TMCS),
dimethylsilyidimethylamine (DMSDMA),
dimethylsilyidiethylamine (DMSDEA),
bis(dimethylamino)methyl silane (B[DMA]MS),
bis(dimethylamino)dimethyl silane (B[DMA]DS),
dimethylaminopentamethyldisilane (DMAPMDS),
dimethylaminodimethyidisilane (DMADMDS),
disila-aza-cyclopentane (TDACP),
disila-oza-cyclopentane (TDOCP),
triethylchlorosilane (TECS),
tetramethoxysilane (TMOS),
dimethyldimethoxysilane (DMDMOS),
tetraethoxysilane (TEOS),
methyltriethoxysilane (MTEOS),
dimethyldiethoxysilane (DMDEOS),
vinyltriethoxysilane (VTEOS),
trimethylmethoxysilane (TMMS),
trimethylethoxysilane (TMES),
trimethylsilanol (TMS-OH),
bis(trimethoxysilyl)hexane,
bis(trimethoxysilyl)octane,
bis(trimethylsilylmethyl)dimethoxysilane,
bistrimethoxysilylethane,
cyclohexylmethyldimethoxysilane,
cyclohexyltrimethoxysilane,
dicyclopentyidimethoxysilane,
diisobutyidimethoxysilane,
diisopropyidimethoxysilane,
dimethyldimethoxysilane,
hexadecyltrimethoxysilane,
octyidimethylmethoxysilane,
trimethoxysilane,
trimethylmethoxysilane, or
tris(dimethylsiloxy)ethoxysilane, or
any combination thereof.

The alkyl siloxane can, for example, comprise:
(3-glycidoxypropyl)pentamethyldisiloxane,
1,1,1,3,3,5,5-heptamethyltrisiloxane,
1,1,1,5,5,5-hexamethyltrisiloxane,
1,1,3,3,5,5,7,7-octamethyltetrasiloxane,
1,1,3,3,5,5-hexamethyltrisiloxane,
1,1,3,3-tetracyclopentyldichlorodisiloxane,
1,1,3,3-tetraethoxy-1,3-dimethyldisiloxane,
1,1,3,3-tetraisopropyl-1,3-dichlorodisiloxane,
1,1,3,3-tetraisopropyldisiloxane,
1,1,3,3-tetramethyl-1,3-diethoxydisiloxane,
1,1,3,3-tetramethyldisiloxane,
1,3-bis(2-aminoethylaminomethyl)tetramethyidisiloxane,
1,3-bis(3-aminopropyl)tetramethyldisiloxane,
1,3-bis(chloromethyl)-1,1,3,3-tetrakis(trimethylsiloxy)disiloxane,
1,3-bis(chloropropyl)tetramethyidisiloxane,
1,3-bis(glycidoxypropyl)tetramethyldisiloxane,
1,3-bis(hydroxybutyl)tetramethyldisiloxane,
1,3-bis(hydroxypropyl)tetramethyldisiloxane,
1,3-bis(trimethylsiloxy)-1,3-dimethyldisiloxane,
1,3-diallyleterakis(trimethylsiloxy)disiloxane,
1,3-diallyltetramethyldisiloxane,
1,3-dichlorotetramethyldisiloxane,
1,3-diethyltetramethyldisiloxane,
1,3-diethynyltetramethyldisiloxane,
1,3-dimethyltetramethoxydisiloxane,
1,3-dioctyltetramethyldisiloxane,
1,3-divinyl-1,3-dimethyl-1,3-dichlorodisiloxane,
1,3-divinyltetraethoxydisiloxane,
1,3-divinyltetramethyldisiloxane,
1,5-dichlorohexamethyltrisiloxane,
1,5-divinylhexamethyltrisiloxane,
1,7-dichlorooctamethyltetrasiloxane,
1-allyl-1,1,3,3-tetramethyldisiloxane,
2-[methoxy(polyethyleneoxy)propyl]heptamethyltrisiloxane,
3,5-bis(chloromethyl)octamethyltetrasiloxane,
3-[hydroxy(polyethyleneoxy)propyl]heptamethyltrisiloxane,
3-aminopropylpentamethyldisiloxane,
3-chloromethylheptamethyltrisiloxane,
3-octylheptamethyltrisiloxane,
bis(3-chloroisobutyl)tetramethyldisiloxane,
bis(chloromethyl)tetramethyldisiloxane,
bis(cyanopropyl)tetramethyidisiloxane,
bis(tridecafluoro-1,1,2,2-tetrahydrooctyl)tetramethyldisiloxane,
bis(trifluoropropyl)tetramethyldisiloxane,
bis[(biscycloheptenyl)ethyl]tetramethyldisiloxane, bis-2-[3,4-(epoxycylcohexyl)ethyl]tetramethyldisiloxane,
chloromethylpentamethyldisiloxane,
decamethylcyclopentasiloxane,
decamethyltetrasiloxane,
divinyletrakis(trimethylsiloxy)disiloxane,
dodecamethylcyclohexasiloxane,
dodecamethylpentasiloxane,
hexaethyidisiloxane,
hexamethyldisiloxane,
hexavinyidisiloxane,
octamethyltrisiloxane,
pentamethyldisiloxane, or
tetradecamethylhexasiloxane, or
any combination thereof.

The aryl silane can, for example, comprise:
benzyltriethoxysilane,
di(p-tolyl)dimethoxysilane,
diphenyldiethoxysilane,
diphenyldihydroxysilane,
diphenyldimethoxysilane,
diphenylmethylethoxysilane,
p-bis(trimethoxysilylmethyl)benzene,
phenyidimethylethoxysilane,
t-butyidiphenylmethoxysilane,
triphenylethoxysilane,
triphenylsilanol,
vinyidiphenylethoxysilane,
dibenzyloxydiacetoxysilane,
phenylacetoxytrimethylsilane, or
phenyldimethylacetoxysilane,
phenyltriacetoxysilane, or
any combination thereof.

The acyl silane can, for example, comprise:
bistrimethylsilyl urea (BTSU),
bis(trimethylsilyl)acetamide (BSA),
bis(trimethylsilyl)trifluoromethylacetamide (BSTFA),
triacetylvinylsilane (TAVS),
N-methyl-N-trimethylsilyl-trifluoroacetamide (MSTFA),
N-methyl-N-tert-butyldimethylsilyl-trifluoroacetamide (MBDSTFA),
N-methyl-N-trimethylsilyl-heptafluorobutyramide (MSHFBA),
acetoxytrimethylsilane (TMAS),
3-trifluoroacetoxypropyltrimethoxysilane,
acetoxyethyidimethylchlorosilane,
acetoxyethylmethyidichlorosilane,
acetoxyethyltriclorosilane,
acetoxyethyltriethoxysilane,
acetoxyethyltrimethoxysilane,
acetoxymethyldimethylacetoxysilane,
acetoxymethyltriethoxysilane,
acetoxymethyltrimethoxysilane,
acetoxymethyltrimethylsilane,
acetoxypropylmethyldichlorosilane,
dimethyidiacetoxysilane,
di-t-butyldiacetoxysilane,
ethyltriacetoxysilane,
methyltriacetoxysilane,
tetraacetoxysilane,
tetrakis(trifluoroacetoxy)silane,
triethylacetoxysilane,
vinylmethyldiacetoxysilane,
vinyltriacetoxysilane,
dibenzyloxydiacetoxysilane,
phenylacetoxytrimethylsilane,
phenyidimethylacetoxysilane, or
phenyltriacetoxysilane, or
any combination thereof.

The cyclo siloxane can, for example, comprise:
1,3,5,7-tetramethylcyclotetrasiloxane,
heptamethylcyclotetrasiloxane,
hexaethylcyclotrisiloxane,
hexamethylcyclotrisiloxane,
octamethylcyclotetrasiloxane,
pentamethylcyclopentasiloxane,
pentavinylpentamethylcyclopentasiloxane,
tetraethylcyclotetrasiloxane,
hexaphenylcyclotrisiloxane,
octaphenylcyclotetrasiloxane,
(acetoxyethyl)heptamethylcylcotetrasiloxane, or
tetrakis(diphenylphosphinoethyl)tetramethylcylcotetrasiloxane, or
any combination thereof.

The polysilsesquioxane (PSS) can, for example, comprise:
octamethyl silsesquioxane,
decamethyl silsesquioxane,
octavinyl silsesquioxane,
decavinyl silsesquioxane,
octamethoxy silsesquioxane,
decamethoxy silsesquioxane, or
chloropropylisobutyl-PSS, or
any combination thereof.

The aryl siloxane can, for example, comprise:
1,1,3,3-tetraphenyldimethyidisiloxane,
1,1,3,5,5-pentaphenyl-1,3,5-trimethyltrisiloxane,
1,1,5,5-tetraphenyl-1,3,3,5-tetramethyltrisiloxane,
1,3-dichloro-1,3-diphenyl-1,3-dimethyidisiloxane,
1,3-dichlorotetraphenyidisiloxane,
1,3-diphenyl-1,1,3,3-tetrakis(dimethylsiloxy)disiloxane,
1,3-diphenyl-1,1,3,3-tetramethyldisiloxane,
1,3-divinyl-1,3-diphenyl-1,3-dimethyldisiloxane,
1,4-bis(trimethoxysilylethyl)benzene,
1,5-bis(glycidoxypropyl)-3-phenyl-1,1,3,5,5-pentamethyltrisiloxane,
1,5-divinyl-3,3-diphenyl-1,1,5,5-tetramethyltrisiloxane,
1,5-divinyl-3-phenylpentamethyltrisiloxane,
3,5-diphenyloctamethyltetrasiloxane,
3-phenyl-1,1,3,5,5-pentamethyltrisiloxane,
3-phenylheptamethyltrisiloxane,
bis(m-allylphenyidimethylsilyloctyl)-tetramethyldisiloxane,
bis(pentafluorophenyldimethoxysilane,
divinyltetraphenyidisiloxane,
hexaphenyldisiloxane,
hexaphenylcyclotrisiloxane,
1,3-bis[acrylomethyl)phenethyl]tetramethyldisiloxane,
octaphenylcyclotetrasiloxane,
(acetoxyethyl)heptamethylcylcotetrasiloxane, or
tetrakis(diphenylphosphinoethyl)tetramethylcylcotetrasiloxane, or
any combination thereof.

The acyl siloxane can, for example, comprise:
1,1,1,3,3-pentamethyl-3-acetoxydisiloxane,
1,3-bis(3-carboxypropyl)tetramethyldisiloxane,
1,3-bis(3-methacryloxypropyl)tetrakis(trimethylsiloxy)disiloxane,
1,3-bis(3-methacryloxypropyl)tetramethyidisiloxane,
11-acetoxyundecyltrichlorosilane,
2-[acetoxy(polyethyleneoxy)propyl]heptamethyltrisiloxane,
methacryloxypropylpentamethyldisiloxane, or
1,3-bis[acrylomethyl)phenethyl]tetramethyldisiloxane, or
any combination thereof.

The halo siloxane can, for example, comprise:
hexachlorodisiloxane, or
octachlorotrisiloxane, or
any combination thereof.

According to one embodiment, in addition to exposing the dielectric film to the treating compound, the substrate can be heated in order to assist, or accelerate, the surface reactions facilitated by the exposure. The substrate temperature can range from approximately 50 degrees C. to approximately 450 degrees C., and desirably, the substrate temperature can range from approximately 100 degrees C. to approximately 300 degrees C. For example, the substrate temperature may range from approximately 150 degrees C. to approximately 250 degrees C.

In one embodiment, in addition to exposing the dielectric film to the treating compound, the dielectric film is exposed to molecular fragments of the treating compound. Molecular fragments of the treating compound can be generated by formation of plasma and dissociation of the treating compound within the plasma. In one embodiment, the molecular fragments are generated in-situ, but provide little ion bombardment with the substrate surface. Thus, the plasma generation of this embodiment does not result in a reduction of substrate temperatures during introduction of the treating compound. As would be appreciated by one of ordinary skill in the art, more direct bombardment of the substrate surface may result in reduced treatment process temperatures.

Figure 5:
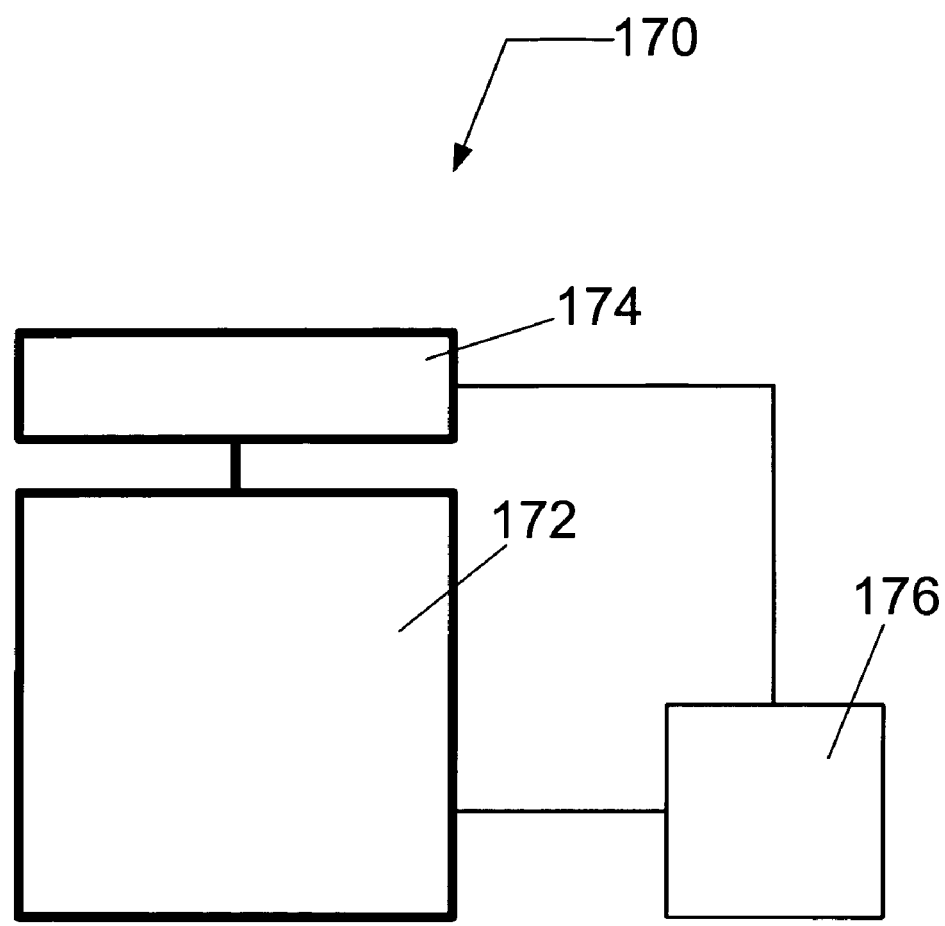
FIG. 5 presents a block diagram of processing system for treating a dielectric film according to an embodiment of the present invention.

FIG. 5 presents a block diagram of a processing system 170 for treating the dielectric film using plural treatment step process in order to perform at least one of cleaning, drying, healing, and sealing the dielectric film following, for instance, etch processing or ashing. Processing system 170 includes a process chamber 172, a fluid distribution system 174 coupled to the process chamber 172 and configured to introduce the treating compound to a substrate mounted in process chamber 172, and a controller 176 coupled to the process chamber 172 and fluid distribution system 174, and configured to control the processing system 170 according to a process recipe. As used herein, the term "fluid" can mean a liquid, gas or supercritical fluid. The processing system 170 can be configured to process a single substrate at one time or a plurality of substrates at one time.

In one embodiment the processing system 170 is configured to introduce the treating compound to the one or more substrates in vapor-phase with or without a process gas, such as a carrier gas. For example, fluid distribution system 174 can include a carrier gas supply system for supplying a carrier gas, or inert gas such as nitrogen, and a reservoir of treating compound, such as a reservoir of HMDS. The fluid distribution system 174 can further include a vapor delivery system that permits bubbling the carrier gas through the reservoir of treating fluid, and transporting the treating compound vapor to a process chamber 172 for exposure to a substrate having a dielectric film to be treated. Furthermore, the fluid distribution system 174 can further include a temperature control system (or heating system) for elevating the temperature of the vapor delivery system in order to prevent the condensation of treating compound vapor therein.

The process chamber 172 can further include a substrate holder for mounting the one or more substrates that may be stationary, translatable, or rotatable. Additionally, the substrate holder can be configured to heat and/or control the temperature of the one or more substrates in order to assist the surface reactions upon exposure of the dielectric film to the treating compound. Alternatively, a heating system can be coupled to process chamber 172, and can be configured to heat the one or more substrates. The substrate temperature, for each substrate, can range from approximately 50 degrees C. to approximately 450 degrees C., and desirably, the substrate temperature can range from approximately 100 degrees C. to approximately 300 degrees C. For additional details, an exemplary vapor transport-supply apparatus is described in U.S. Pat. No. 5,035,200, assigned to Tokyo Electron Limited, which is incorporated herein by reference in its entirety. Further, for additional details, an exemplary vapor treatment system is described in U.S. Pat. No. 6,709,523, assigned to Tokyo Electron Limited, which is incorporated herein by reference in its entirety.

Additionally, the process chamber 172 can include an in-situ plasma generation system configured to form plasma and cause molecular dissociation of the treating compound.

Controller 176 includes a microprocessor, memory, and a digital I/O port (potentially including D/A and/or A/D converters) capable of generating control voltages sufficient to communicate and activate inputs to the process chamber 172 and the fluid distribution system 174 as well as monitor outputs from these systems. A program stored in the memory is utilized to interact with the systems 172 and 174 according to a stored process recipe. Furthermore, controller 176 can interact with the heating system and the in-situ plasma generation system according to a stored process recipe.

Alternately, or in addition, controller 176 can be coupled to a one or more additional controllers/computers (not shown), and controller 176 can obtain setup and/or configuration information from an additional controller/computer.

In FIG. 5, singular processing elements (172 and 174) are shown, but this is not required for the invention. The processing system 170 can comprise any number of processing elements having any number of controllers associated with them in addition to independent processing elements.

The controller 176 can be used to configure any number of processing elements (172 and 174), and the controller 176 can collect, provide, process, store, and display data from processing elements. The controller 176 can comprise a number of applications for controlling one or more of the processing elements. For example, controller 176 can include a graphic user interface (GUI) component (not shown) that can provide easy to use interfaces that enable a user to monitor and/or control one or more processing elements.

The processing system 170 can also comprise a pressure control system (not shown). The pressure control system can be coupled to the processing chamber 172, but this is not required. In alternate embodiments, the pressure control system can be configured differently and coupled differently. The pressure control system can include one or more pressure valves (not shown) for exhausting the processing chamber 172 and/or for regulating the pressure within the processing chamber 172. Alternately, the pressure control system can also include one or more pumps (not shown). For example, one pump may be used to increase the pressure within the processing chamber, and another pump may be used to evacuate the processing chamber 172. In another embodiment, the pressure control system can comprise seals for sealing the processing chamber.

Furthermore, the processing system 170 can comprise an exhaust control system. The exhaust control system can be coupled to the processing chamber 172, but this is not required. In alternate embodiments, the exhaust control system can be configured differently and coupled differently. The exhaust control system can include an exhaust gas collection vessel (not shown) and can be used to remove contaminants from the processing fluid. Alternately, the exhaust control system can be used to recycle the processing fluid.

Figure 6:
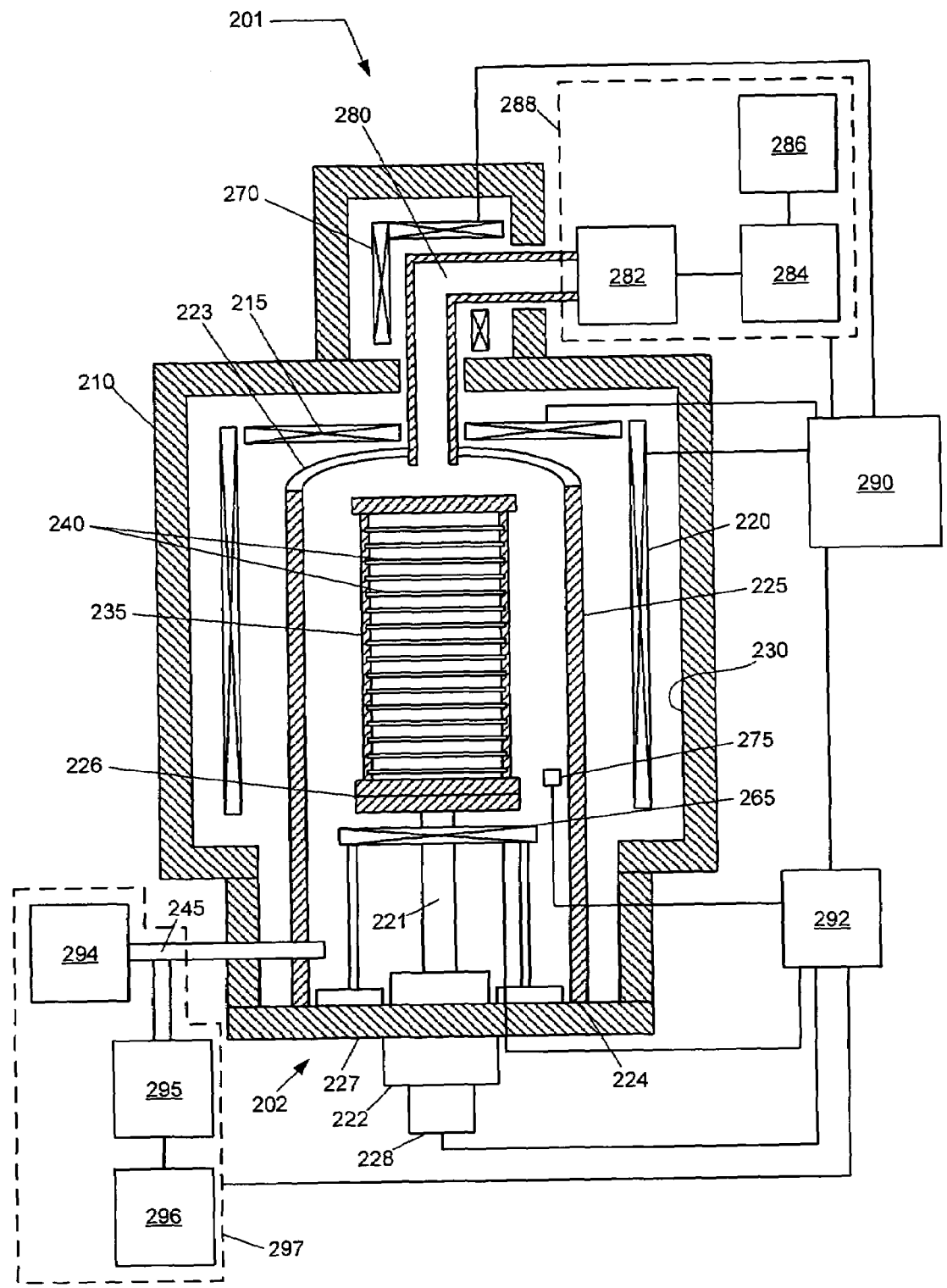
FIG. 6 presents a processing system for treating a dielectric film according to another embodiment of the present invention.

Referring now to FIG. 6, a simplified block diagram of a processing system is shown according to another embodiment. The processing system includes a batch processing system 201 configured treat a plurality of substrates with a multi-step process. The batch processing system 201 contains a process chamber 210 and a process tube 225 that has an upper end 223 connected to an exhaust system 288 via an exhaust duct 280, and a lower end 224 hermetically joined to a lid 227 of cylindrical manifold 202. The exhaust duct 280 discharges gases from the process tube 225 to exhaust system 288 to maintain a pre-determined pressure, e.g., atmospheric or below atmospheric pressure, in the processing system 201. A substrate holder 235 for holding a plurality of substrates (wafers) 240 in a tier-like manner (in respective horizontal planes at vertical intervals) is placed in the process tube 225. The substrate holder 235 resides on a turntable 226 that is mounted on a rotating shaft 221 penetrating the lid 227 and driven by a drive system 228 (which may comprise an electric motor). The turntable 226 can be rotated during processing to improve overall film uniformity or, alternately, the turntable can be stationary during processing. The lid 227 is mounted on an elevator 222 for transferring the substrate holder 235 in and out of the process tube 225. When the lid 227 is positioned at its uppermost position, the lid 227 is adapted to close the open end of the manifold 202.

A fluid distribution system 297 is configured for introducing one or more treating compounds with or without process gases into the process chamber 210. A plurality of gas supply lines can be arranged around the manifold 202 to supply a plurality of gases into the process tube 225 through the gas supply lines. In FIG. 6, only one gas supply line 245 among the plurality of gas supply lines is shown. The gas supply line 245 (as shown) is connected to a process gas source 294. In general, the process gas source 294 can supply process gases for processing the substrates 240, including, gases for depositing films (e.g., silicon-containing gases for depositing silicon-containing films) onto the substrates 240, gases for etching the substrates 240, gases for oxidizing the substrates 240, or gases for assisting the treating compounds described above. A plasma source 295 is operatively coupled to the process chamber 210. For example, the plasma source 295 may be located remotely, and may be operatively coupled to process chamber 210 by the gas supply line 245. The plasma source 295 is configured for exciting at least one of a process gas or a treating compound from the gas source 296, and the excited (dissociated) gas is subsequently introduced into the process tube 225 by the gas supply line 245 of the fluid distribution system 297. The plasma source 295 can, for example, be a microwave plasma source, a radio frequency (RF) plasma source, or a plasma source powered by light radiation. In the case of a microwave plasma source, the microwave power can be between about 500 Watts (W) and about 5,000 W. The microwave frequency can, for example, be 2.45 GHz or 8.3 GHz. In one example, the remote plasma source can be a Downstream Plasma Source Type AX7610, manufactured by MKS Instruments, Wilmington, Mass., USA.

A cylindrical heat reflector 230 is disposed so as to cover the reaction tube 225. The heat reflector 230 has a mirror-finished inner surface to suppress dissipation of radiation heat radiated by a heating system including a main heater 220, a bottom heater 265, a top heater 215, and an exhaust duct heater 270. A helical cooling water passage (not shown) may be formed in the wall of the process chamber 210 as a cooling medium passage.

The exhaust system 288 comprises a vacuum pump 286, a trap 284, and automatic pressure controller (APC) 282. The vacuum pump 286 can, for example, include a dry vacuum pump capable of a pumping speed up to 20,000 liters per second (and greater). During processing, gases can be introduced into the process chamber 210 via the gas supply line 245 of the fluid distribution system 297 and the process pressure can be adjusted by the APC 282. The trap 284 can collect un-reacted precursor material and by-products from the process chamber 210.

The process monitoring system 292 comprises a sensor 275 capable of real-time process monitoring and can, for example, include a mas spectrometer (MS), a Fourier transform infra-red (FTIR) spectrometer, or a particle counter. A controller 290 includes a microprocessor, a memory, and a digital I/O port capable of generating control voltages sufficient to communicate and activate inputs to the batch processing system 201 as well as monitor outputs from the batch processing system 201. Moreover, the controller 290 is coupled to and can exchange information with fluid distribution system 297, drive system 228, process monitoring system 292, heating system 220, 215, 265, and 270, and exhaust system 288. The controller 290 may be implemented as a DELL PRECISION WORKSTATION 610™.

The controller 290 may also be implemented as a general purpose computer, processor, digital signal processor, etc., which causes a substrate processing apparatus to perform a portion or all of the processing steps of the invention in response to the controller 290 executing one or more sequences of one or more instructions contained in a computer readable medium. The computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controller 290 may be locally located relative to the batch processing system 201, or it may be remotely located relative to the batch processing system 201 via an internet or intranet. Thus, the controller 290 can exchange data with the batch processing system 201 using at least one of a direct connection, an intranet, and the internet. The controller 290 may be coupled to an intranet at a customer site (i.e., a device maker, etc.), or coupled to an intranet at a vendor site (i.e., an equipment manufacturer). Furthermore, another computer (i.e., controller, server, etc.) can access controller 290 to exchange data via at least one of a direct connection, an intranet, and the internet.

Figure 7:
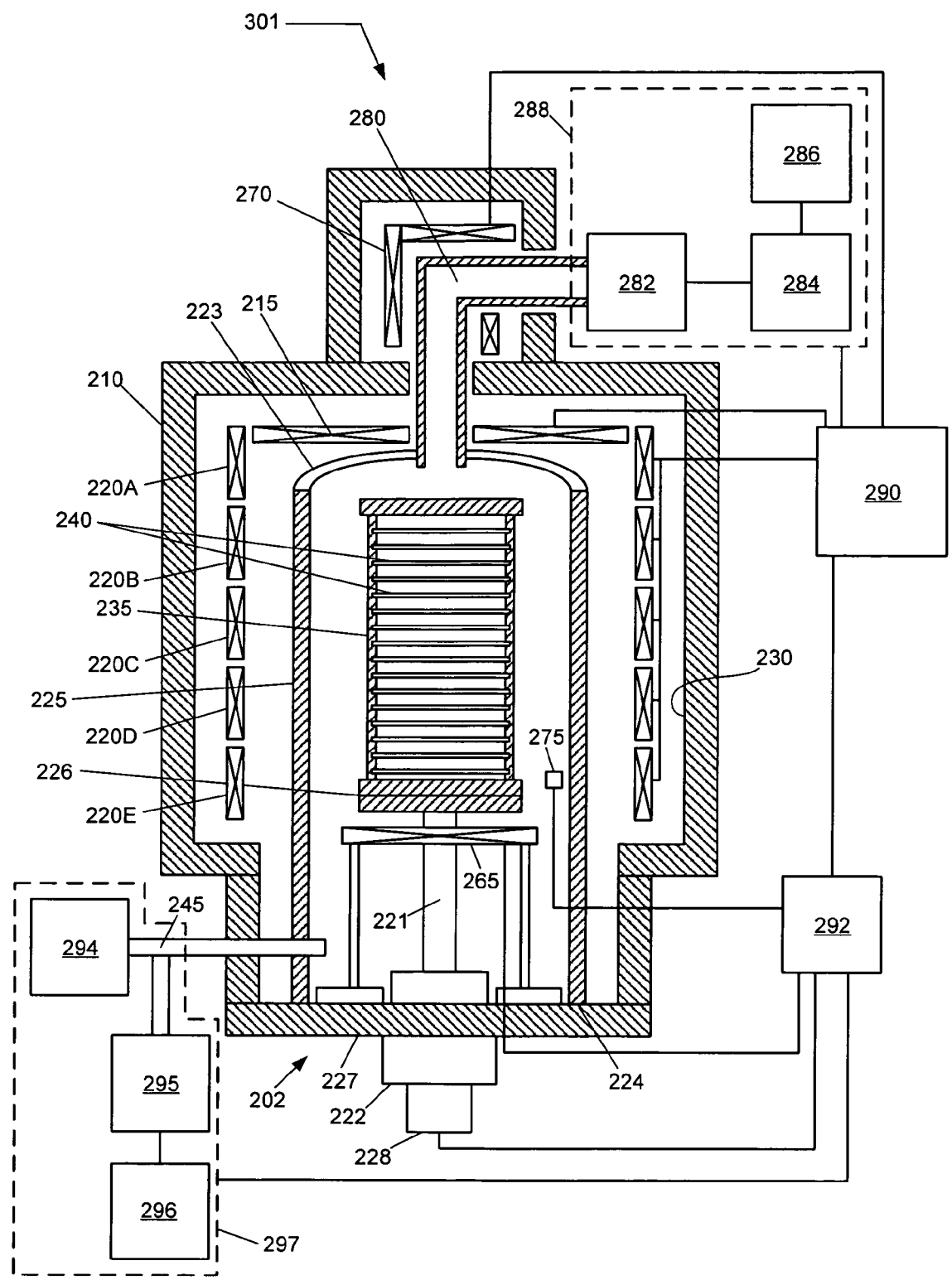
FIG. 7 presents a processing system for treating a dielectric film according to another embodiment of the present invention.

Referring now to FIG. 7, a simplified block diagram of a batch processing system is shown according to another embodiment. The batch processing system 301 contains many of the same features as batch processing system 201 illustrated in FIG. 6 and described above. However, batch processing system 301 further comprises a multiple zone main heater having heating elements 220A, 220B, 220C, 220D and 220E. Although, five (5) heating elements are illustrated, the number of heating elements may vary, e.g., the number may more or less. For example, each heating element may comprise a carbon resistive heating element, or other conventional resistive heating element. Additionally, the configuration, or geometry, or both the configuration and geometry of the heating elements may vary from that illustrated in FIG. 7. The multiple zone main heater can facilitate additional control of spatial variations in substrate temperature throughout the batch of substrates. For example, the multiple zone main heater can achieve a heating ramp rate of up to approximately 40 degrees C. per minute, with a temperature controllability of plus or minus 1 degree C.

Figure 8:
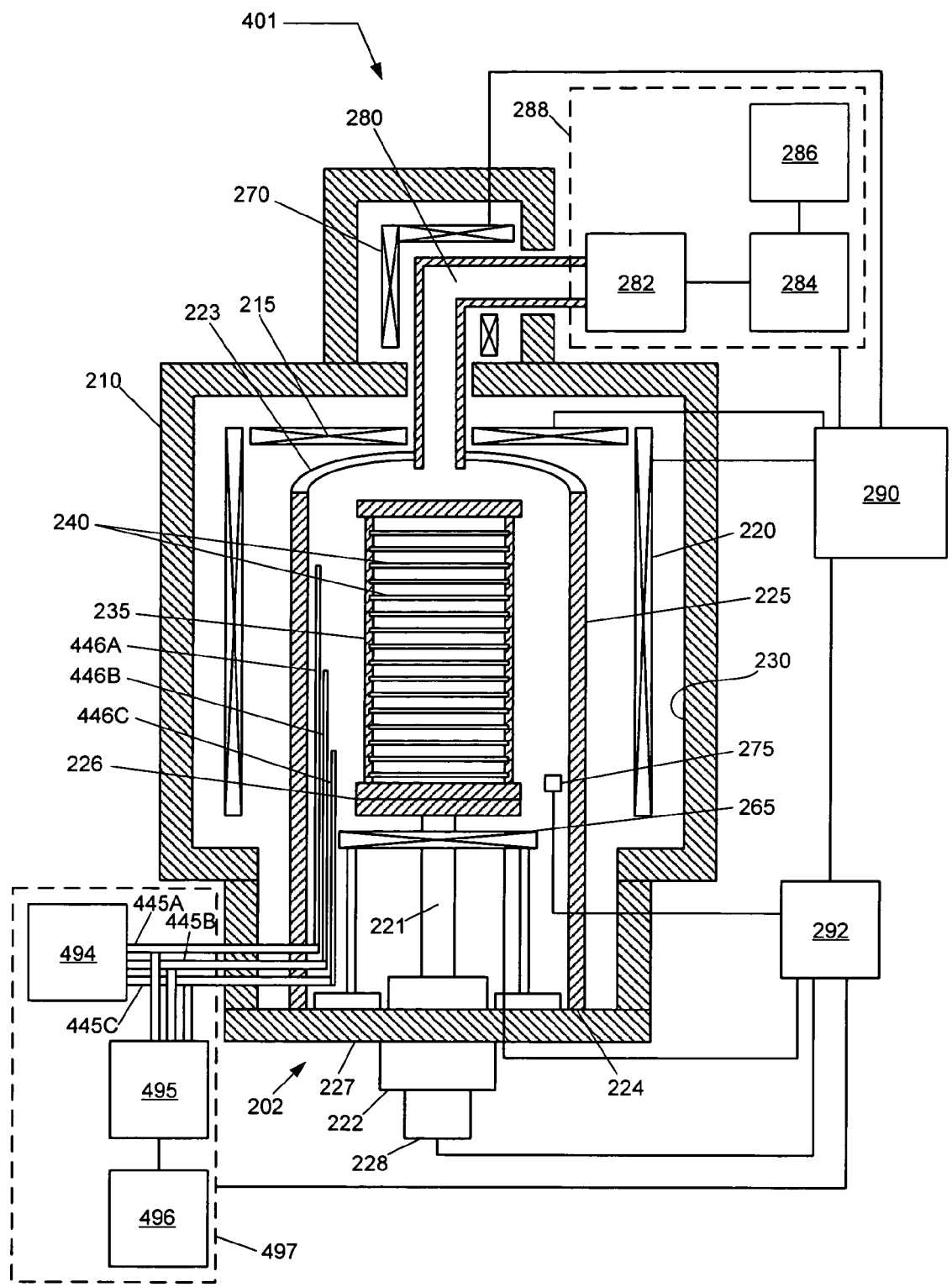
FIG. 8 presents a processing system for treating a dielectric film according to another embodiment of the present invention.

Referring now to FIG. 8, a simplified block diagram of a batch processing system is shown according to another embodiment. The batch processing system 401 contains many of the same features as batch processing system 201 illustrated in FIG. 6 and described above. However, batch processing system 401 further comprises a multiple zone gas injection system comprising a plurality of gas supply lines 445A, 445B and 445C providing a flow of treating compound to a plurality of zones along substrate holder 235 via a plurality of gas injection devices 446A, 446B and 446C. Each gas injection device 446A-C may include one or more gas injection orifices of varying size or distribution or both along each gas injection device. Any flow property, including the concentration of treating compound, flow rate of treating compound, etc., may be varied or controlled to each region of the process chamber 210.

Figure 9:
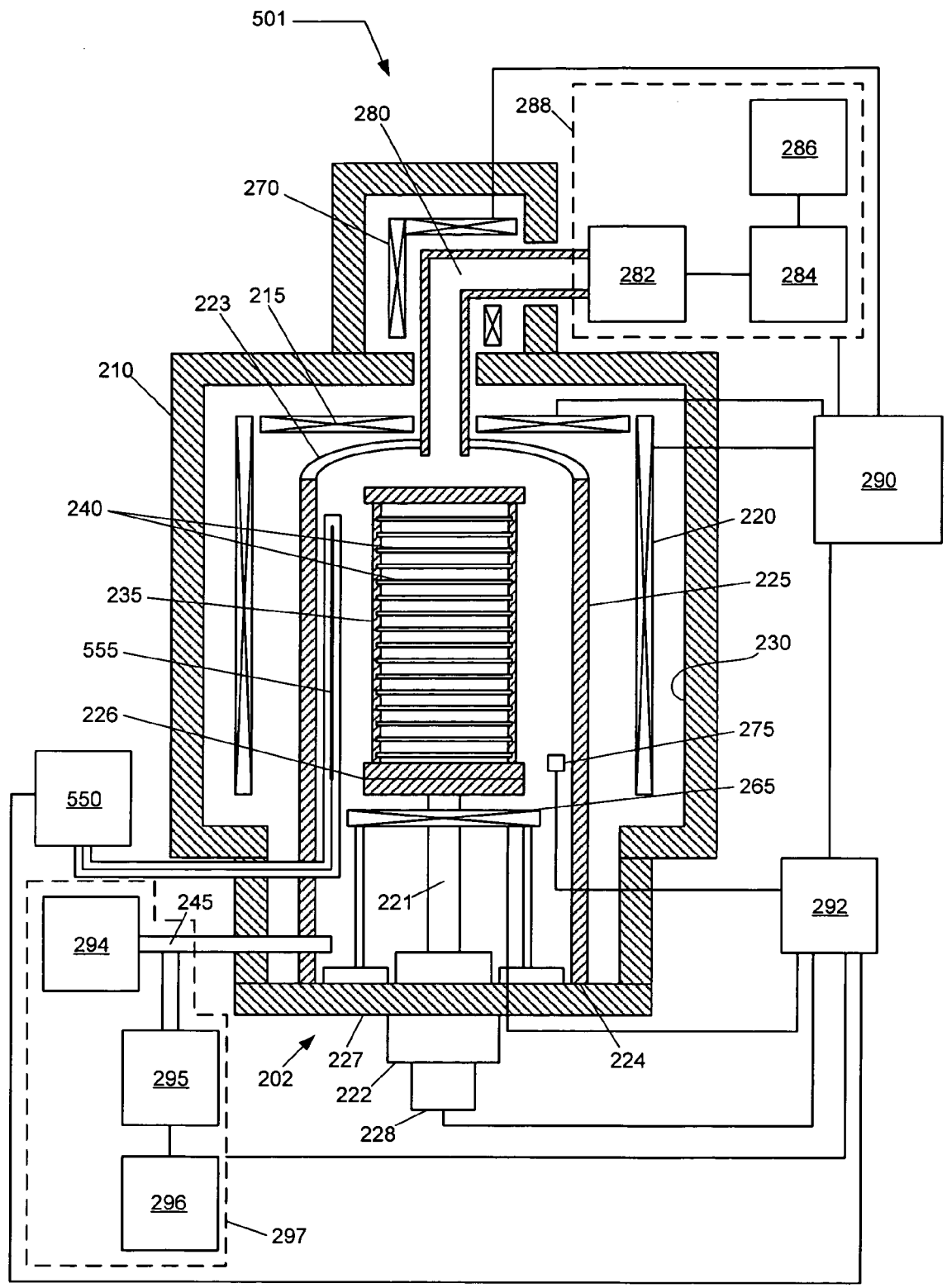
FIG. 9 presents a processing system for treating a dielectric film according to another embodiment of the present invention.

Referring now to FIG. 9, a simplified block diagram of a batch processing system is shown according to another embodiment. The batch processing system 501 contains many of the same features as batch processing system 201 illustrated in FIG. 6 and discussed above. However, batch processing system 501 further comprises an in-situ plasma generation system 550 having a power source and optional impedance match network coupled to an electrode 555 located within reaction tube 225 of process chamber 210. The power source may, for example, include a radio frequency (RF) generator configured to couple power to the treating compound through electrode 555. A typical frequency for the application of RF power to electrode 555 can range from about 0.1 MHz to about 200 MHz. An impedance match network may be utilized to maximize the transfer of power by matching the output impedance of the RF generator with the input impedance to the electrode and plasma. A batch processing system capable of generating an in-situ plasma is described in Japanese patent application no. JP2004-343017A filed on May 19, 2003 and published on Dec. 2, 2004, the entire content of which is incorporated herein by reference. Furthermore, as illustrated in FIG. 8, the treating compound may be introduced proximate electrode 555 using one or more gas conduits.

It is to be understood that the batch-type processing systems 201, 301, 401 and 501 depicted in FIGS. 6, 7, 8 and 9 are shown for exemplary purposes only, as many variations of the specific hardware can be used to practice the present invention, and these variations will be readily apparent to one having ordinary skill in the art. The batch processing systems 201, 301, 401 and 501 in FIGS. 6, 7, 8 and 9 can, for example, process substrates of any size, such as 200 mm substrates, 300 mm substrates, or even larger substrates. Furthermore, the batch processing systems 201, 301, 401 and 501 can simultaneously process up to about 200 substrates, or more. Alternately, the processing system can simultaneously process up to about 25 substrates. In addition to semiconductor substrates, e.g., silicon wafers, the substrates can, for example, comprise LCD substrates, glass substrates, or compound semiconductor substrates.

For example, an exemplary vapor transport-supply apparatus is described in U.S. Pat. No. 5,035,200, assigned to Tokyo Electron Limited, which is incorporated herein by reference in its entirety. Additionally, for example, an exemplary vapor transport-supply apparatus may include a TEL-Formula® batch processing system, commercially available from Tokyo Electron Limited.

In one embodiment, a dielectric film on one or more substrates can be treated with a plural treatment step process in order to thermally treat and chemically treat the dielectric film. Thermal treatment of the dielectric film can include annealing the dielectric film, or drying the dielectric film in order to remove contaminants, such as water, or other volatile constituents. Chemical treatment of the dielectric film can include cleaning the dielectric film, healing the dielectric film by restoring or partially restoring the dielectric constant of the dielectric film, or sealing or partially sealing the dielectric film. For example, any one of these process steps may be performed on exposed surfaces in the dielectric film following formation of the dielectric film, etch processing of the dielectric film, ashing of the dielectric film, polishing of the dielectric film, or processing of the dielectric film during preparation of an electronic device. In one embodiment, a plasma is generated during introduction of the treating compound in order to facilitate sealing of the dielectric film; however, some sealing of the dielectric may occur without plasma generation. In another embodiment, a first chemical treatment is performed with a treating compound without a plasma, and a second treatment includes generating a plasma with the same treating compound and/or introducing another treating compound and generating a plasma. Still further, different treating compounds may be introduced concurrently or sequentially as part of the treatment step.

During chemical treatment, each treating compound in the multiple step process can include process compositions, such as but not limited to: cleaning compositions for removing contaminants, residues, hardened residues, photoresist, hardened photoresist, post-etch residue, post-ash residue, post chemical-mechanical polishing (CMP) residue, post-polishing residue, or post-implant residue, or any combination thereof; cleaning compositions for removing particulate; drying compositions for drying thin films, porous thin films, porous low dielectric constant materials, or air-gap dielectrics, or any combination thereof; film-forming compositions for preparing dielectric thin films, metal thin films, or any combination thereof; healing compositions for restoring or partially restoring the dielectric constant of low dielectric constant (low-k) films; sealing compositions for sealing or partially sealing dielectric films or porous films; or any combination thereof.

For example, a treating compound configured to clean a dielectric film can include an oxygen containing compound, a nitrogen containing compound, a hydrogen containing compound, a fluorine containing compound, a halogen containing compound, a hydrocarbon compound, or any combination thereof, or an excited specie of any of the aforementioned materials, or an ionized specie of any of the aforementioned materials, or a radical of any of the aforementioned materials. For instance, the treating compound can include ozone, oxygen radical, or fluorine radical. Treatment of the dielectric film can further include introduction of a purge gas to the treatment system before cleaning, or after cleaning, or both. The purge gas can include an inert gas, such as a noble gas. When healing (restoring or partially restoring the dielectric constant of) a dielectric film, the treating compound can include any one of the compounds described above in a vapor phase. Additionally, when sealing or partially sealing a porous dielectric film, the treating compound can include any one of the compounds described above in a vapor phase.

In a vapor phase treatment system, the treating compound can include non-plasma gaseous mixtures, or it may include plasma. In a chemical treatment process (non-plasma), the dielectric film on one or more substrates is exposed to a treating compound while the one or more substrates are optionally heated. In a plasma assisted chemical treatment process (plasma), the dielectric film on one or more substrates is exposed to a treating compound and molecular fragments of that treating compound while the one or more substrates are optionally heated.

Figure 10:
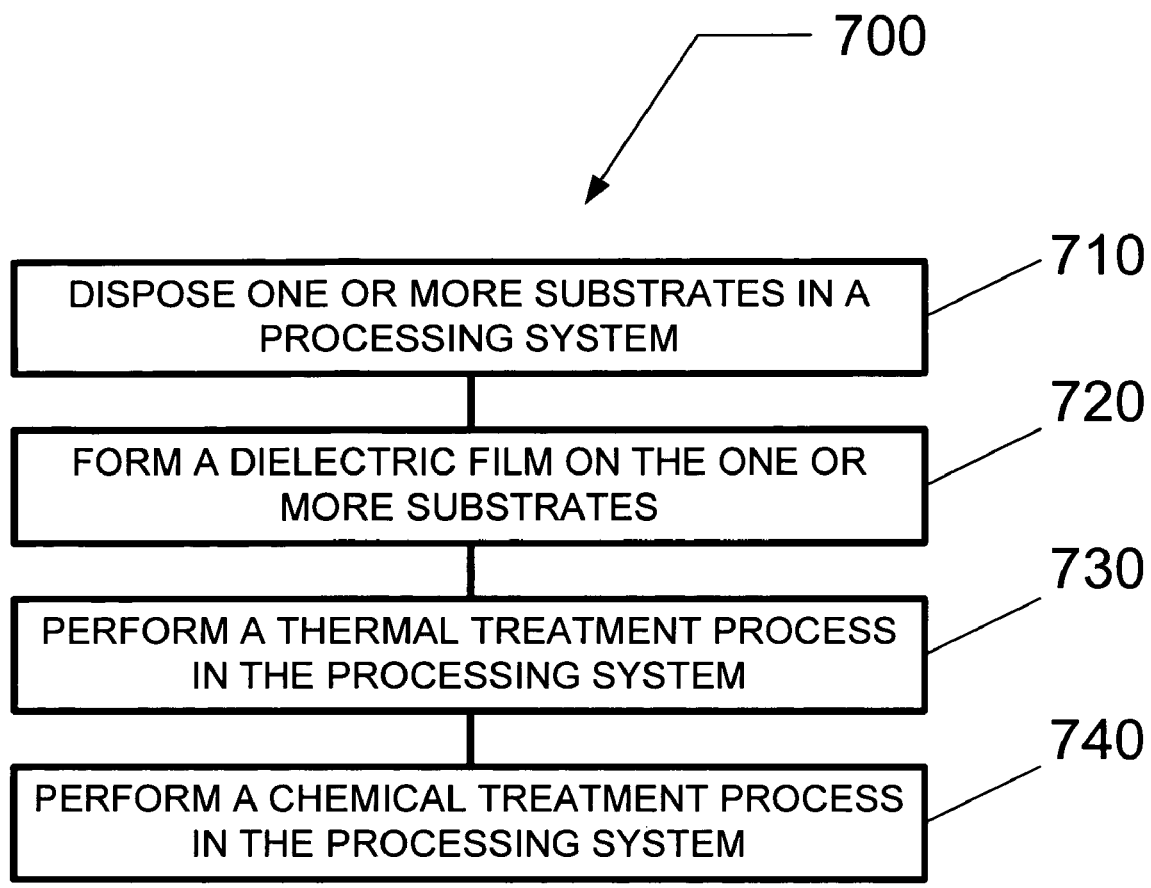
FIG. 10 presents a flow chart of a method of treating a dielectric film according to an embodiment of the present invention.

Referring now to FIG. 10, a method of treating a dielectric film on one or more substrates using a plural treatment step process is described. The method includes a flow chart 700 beginning in 710 with forming the dielectric film on the one or more substrates, wherein the dielectric film comprises an initial dielectric constant having a value less than the dielectric constant of $SiO_2$. In 720, the one or more substrates are disposed in a process chamber configured to perform plural treatment processes on the dielectric film. The processing system can include any one of the processing systems illustrated in FIGS. 5, 6, 7, 8 or 9.

In 730, a thermal treatment process that includes annealing the one or more substrates is performed in order to remove volatile constituents from the dielectric film on the one or more substrates. The thermal treatment can comprise elevating the temperature of the one or more substrates while exposing the one or more substrates to an inert atmosphere. For example, the temperature can range from approximately 50 degrees C. to approximately 500 degrees C., and desirably the temperature can range from approximately 100 degrees C. to approximately 200 degrees C. Additionally, for example, the inert atmosphere can include the introduction of a noble gas, such as helium, argon, xenon, etc., or nitrogen ($N_2$).

In 740, a chemical treatment process is performed on the one or more substrates, including: introducing a treating compound to said the dielectric film on the one or more substrates, and heating the one or more substrates. The chemical treatment can comprise cleaning the dielectric film, healing the dielectric film by restoring or partially restoring the dielectric constant of the dielectric film, or sealing or partially sealing the dielectric film, or any combination of two or more thereof. The treating chemical can include any one of the chemical compositions described above. Additionally, for example, the temperature can range from approximately 50 degrees C. to approximately 450 degrees C., and desirably the temperature can range from approximately 100 degrees C. to approximately 300 degrees C. The chemical treatment process may or may not include plasma, wherein plasma is formed either within the process chamber or outside the process chamber in a remote plasma source. When plasma assisted chemical treatment process is utilized, the one or more substrates are exposed to the treating compound and molecular fragments of the treating compound as a result of molecular dissociation in the plasma.

In one example, the plural treatment step process is performed on a dielectric layer following at least one of an etching process, an ashing process, or a wet cleaning process, whereby the plural treatment step process facilitates drying the dielectric film, and healing the dielectric film or sealing the dielectric film or both. In another example, the plural treatment step process precedes the deposition of a thin film on the dielectric layer. The thin film can comprise a barrier layer utilized to prevent migration of metal from metal lines and vias into the dielectric following metallization. In yet another example, the plural treatment step process precedes a plasma treatment step to alter the exposed surfaces of the dielectric film in order to promote adhesion of a thin film deposited thereon.

The present invention has the capability of passivating a dielectric surface, and being compatible with other processing steps, such as cleaning steps configured to remove post-etch residues (including, but not limited to, spin-on polymeric anti-reflective coating layers and photopolymers) for patterned dielectric layers in a vapor phase processing environment.

The present invention also has been observed to restore or partially restore the dielectric constant (k-value) of dielectric materials lost after patterning steps, and has been shown to produce low-k dielectric layers that are stable over time. The present invention also has been observed to seal or partially seal exposed porous surfaces.

Although only certain exemplary embodiments of this invention have been described in detail above, those skilled in the art will readily appreciate that many modifications are possible in the exemplary embodiments without materially departing from the novel teachings and advantages of this invention. For example, while damage to the low-k surface is primarily described with respect to etch or ash created damage, the present invention is not limited to treating only such damage, and may be implemented to treat damage to low-k films caused by other handling or processing of the wafer containing a low-k film. Further, while the fluid distribution system has been described with respect to a vapor phase distribution system, other known systems for distributing the treating compound or other compounds as a liquid or supercritical fluid may be implemented by one of ordinary skill in the art. Accordingly, all such modifications are intended to be included within the scope of this invention.

What is claimed is:

1. A method of treating a dielectric film on one or more substrates, comprising:
    disposing said one or more substrates in a process chamber configured to perform plural treatment processes on a dielectric film formed on at least one of said one or more substrates, wherein said dielectric film comprises an initial dielectric constant having a value less than the dielectric constant of $SiO_2$;
    performing a thermal treatment process that includes annealing said one or more substrates in order to remove volatile constituents from said dielectric film on said one or more substrates; and
    after performing the thermal treatment process, performing a chemical treatment process on said one or more substrates, comprising:
        introducing a treating compound to said dielectric film on said one or more substrates, and
        heating said one or more substrates,
        wherein said performing a thermal treatment process comprises increasing the percentage of silanol groups that are replaced with silyl groups on a surface of the dielectric film on the one or more substrates.

2. The method of claim 1, wherein said performing said chemical treatment process comprises introducing said treating compound without forming a plasma within the process chamber.

3. The method of claim 1, wherein said performing said chemical treatment process comprises forming plasma within said process chamber in order to produce fragmented constituents of said treating compound.

4. The method of claim 1, wherein said performing said chemical treatment process facilitates healing said dielectric film on said one or more substrates by restoring or partially restoring a dielectric constant of said dielectric film to said initial dielectric constant, or sealing said dielectric film on said one or more substrates by sealing or partially sealing exposed pores on said at least one surface of said dielectric film, or both.

5. The method of claim 3, wherein said performing said chemical treatment process facilitates healing said dielectric film on said one or more substrates by restoring or partially restoring a dielectric constant of said dielectric film to said initial dielectric constant, or sealing said dielectric film on said one or more substrates by sealing or partially sealing exposed pores on said at least one surface of said dielectric film, or both.

6. The method of claim 1, wherein said treating compound comprises a compound containing $C_xH_y$, wherein x and y represent integers greater than or equal to unity.

7. The method of claim 1, wherein said treating compound comprises an alkyl silane, an alkoxysilane, an alkyl siloxane, an alkoxysiloxane, an aryl silane, an acyl silane, a cyclo siloxane, a polysilsesquioxane (PSS), an aryl siloxane, an acyl siloxane, or a halo siloxane, or any combination thereof.

8. The method of claim 1, wherein said treating compound comprises an alkyl silane comprising:
hexamethyldisilazane (HMDS),
tetramethyldisilazane (TMDS),
trimethylsilyldimethylamine (TMSDMA),
trimethylsilyldiethylamine (TMSDEA),
N-trimethylsilyl-imidazole (TMSI),
methyltrimethoxysilane (MTMOS),
vinyltrimethoxysilane (VTMOS),
trimethylchlorosilane (TMCS),
dimethylsilyldimethylamine (DMSDMA),
dimethylsilyldiethylamine (DMSDEA),
bis(dimethylamino)methyl silane (B[DMA]MS),
bis(dimethylamino)dimethyl silane (B[DMA]DS),
dimethylaminopentamethyldisilane (DMAPMDS),
dimethylaminodimethyldisilane (DMADMDS),
disila-aza-cyclopentane (TDACP),
disila-oza-cyclopentane (TDOCP),
triethylchlorosilane (TECS),
tetramethoxysilane (TMOS),
dimethyldimethoxysilane (DMDMOS),
tetraethoxysilane (TEOS),
methyltriethoxysilane (MTEOS),
dimethyldiethoxysilane (DMDEOS),
vinyltriethoxysilane (VTEOS),
trimethylmethoxysilane (TMMS),
trimethylethoxysilane (TMES),
trimethylsilanol (TMS-OH),
bis(trimethoxysilyl)hexane,
bis(trimethoxysilyl)octane,
bis(trimethylsilylmethyl)dimethoxysilane,
bistrimethoxysilylethane,
cyclohexylmethyldimethoxysilane,
cyclohexyltrimethoxysilane,
dicyclopentyldimethoxysilane,
diisobutyldimethoxysilane,
diisopropyldimethoxysilane,
dimethyldimethoxysilane,
hexadecyltrimethoxysilane,
octyldimethylmethoxysilane,
trimethoxysilane,
trimethylmethoxysilane, or
tris(dimethylsiloxy)ethoxysilane, or any combination thereof.

9. The method of claim 1, wherein said treating compound comprises an alkyl siloxane comprising:
(3-glycidoxypropyl) pentamethyldisiloxane,
1,1,1,3,3,5,5-heptamethyltrisiloxane,
1,1,1,5,5,5-hexamethyltrisiloxane,
1,1,3,3,5,5,7,7-octamethyltetrasiloxane,
1,1,3,3,5,5-hexamethyltrisiloxane,
1,1,3,3-tetracyclopentyldichlorodisiloxane,
1,1,3,3-tetraethoxy-1,3-dimethyldisiloxane,
1,1,3,3-tetraisopropyl-1,3-dichlorodisiloxane,
1,1,3,3-tetraisopropyldisiloxane,
1,1,3,3-tetramethyl-1,3-diethoxydisiloxane,
1,1,3,3-tetramethyldisiloxane,
1,3-bis(2-aminoethylaminomethyl)tetramethyldisiloxane,
1,3-bis(3-aminopropyl)tetramethyldisiloxane,
1,3-bis(chloromethyl)-1,1,3,3-tetrakis(trimethylsiloxy) disiloxane,
1,3-bis(chloropropyl)tetramethyldisiloxane,
1,3-bis(glycidoxypropyl)tetramethyldisiloxane,
1,3-bis(hydroxybutyl)tetramethyldisiloxane,
1,3-bis(hydroxypropyl)tetramethyldisiloxane,
1,3-bis(trimethylsiloxy)-1,3-dimethyldisiloxane,
1,3-diallyleterakis(trimethylsiloxy)disiloxane,
1,3-diallyltetramethyldisiloxane,
1,3-dichlorotetramethyldisiloxane,
1,3-diethyltetramethyldisiloxane,
1,3-diethynyltetramethyldisiloxane,
1,3-dimethyltetramethoxydisiloxane,
1,3-dioctyltetramethyldisiloxane,
1,3-divinyl-1,3-dimethyl-1,3-dichlorodisiloxane,
1,3-divinyltetraethoxydisiloxane,
1,3-divinyltetramethyldisiloxane,
1,5-dichlorohexamethyltrisiloxane,
1,5-divinylhexamethyltrisiloxane,
1,7-dichlorooctamethyltetrasiloxane,
1-allyl-1,1,3,3-tetramethyldisiloxane,
2-[methoxy(polyethyleneoxy)propyl]heptamethyltrisiloxane,
3,5-bis(chloromethyl)octamethyltetrasiloxane,
3-[hydroxy(polyethyleneoxy)propyl]heptamethyltrisiloxane,
3-aminopropylpentamethyldisiloxane,
3-chloromethylheptamethyltrisiloxane,
3-octylheptamethyltrisiloxane,
bis(3-chloroisobutyl)tetramethyldisiloxane,
bis(chloromethyl)tetramethyldisiloxane,
bis(cyanopropyl)tetramethyldisiloxane,
bis(tridecafluoro-1,1,2,2-tetrahydrooctyl)tetramethyldisiloxane, bis(trifluoropropyl)tetramethyldisiloxane,
bis[(biscycloheptenyl)ethyl]tetramethyldisiloxane,
bis-2-[3,4-(epoxycylcohexyl)ethyl]tetramethyldisiloxane,
chloromethylpentamethyldisiloxane,
decamethylcyclopentasiloxane,
decamethyltetrasiloxane,
divinyletrakis(trimethylsiloxy)disiloxane,
dodecamethylcyclohexasiloxane,
dodecamethylpentasiloxane,
hexaethyldisiloxane,
hexamethyldisiloxane,
hexavinyldisiloxane,
octamethyltrisiloxane,
pentamethyldisiloxane, or
tetradecamethyihexasiloxane, or any combination thereof.

10. The method of claim 1 wherein said treating compound comprises an aryl silane comprising:
benzyltriethoxysilane,
di(p-tolyl)dimethoxysilane,
diphenyldiethoxysilane,
diphenyldihydroxysilane,
diphenyldimethoxysilane,
diphenylmethylethoxysilane,
p-bis(trimethoxysilylmethyl)benzene,
phenyldimethylethoxysilane,
t-butyldiphenylmethoxysilane,
triphenylethoxysilane,
triphenylsilanol, vinyldiphenylethoxysilane,
dibenzyloxydiacetoxysilane,
phenylacetoxytrimethylsilane,
phenyldimethylacetoxysilane, or
phenyltriacetoxysilane, or any combination thereof.

11. The method of claim 1, wherein said treating compound comprises an acyl silane comprising:
bistrimethylsilyl urea (BTSU),
bis(trimethylsilyl)acetamide (BSA),
bis(trimethylsilyl)trifluoromethylacetamide (BSTFA),
triacetylvinylsilane (TAVS),
N-methyl-N-trimethylsilyl-trifluoroacetamide (MSTFA),
N-methyl-N-tert-butyldimethylsilyl-trifluoroacetamide (MBDSTFA),
N-methyl-N-trimethylsilyl-heptafluorobutyramide (MSHFBA),
acetoxytrimethylsilane (TMAS),
3-trifluoroacetoxypropyltrimethoxysilane,
acetoxyethyldimethylchlorosilane,
acetoxyethylmethyldichlorosilane,
acetoxyethyltriclorosilane,
acetoxyethyltriethoxysilane,
acetoxyethyltrimethoxysilane,
acetoxymethyldimethylacetoxysilane,
acetoxymethyltriethoxysilane,
acetoxymethyltrimethoxysilane,
acetoxymethyltrimethylsilane,
acetoxypropylmethyldichlorosilane,
dimethyldiacetoxysilane,
di-t-butyldiacetoxysilane,
ethyltriacetoxysilane,
methyltriacetoxysilane,
tetraacetoxysilane,
tetrakis(trifluoroacetoxy)silane,
triethylacetoxysilane,
vinylmethyldiacetoxysilane,
vinyltriacetoxysilane,
dibenzyloxydiacetoxysilane,
phenylacetoxytrimethylsilane,
phenyldimethylacetoxysilane, or
phenyltriacetoxysilane, or any combination thereof.

12. The method of claim 1, wherein said treating compound comprises an cyclo siloxane comprising:
1,3,5,7-tetramethylcyclotetrasiloxane,
heptamethylcyclotetrasiloxane,
hexaethylcyclotrisiloxane,
hexamethylcyclotrisiloxane,
octamethylcyclotetrasiloxane,
pentamethylcyclopentasiloxane,
pentavinylpentamethylcyclopentasiloxane,
tetraethylcyclotetrasiloxane,
hexaphenylcyclotrisiloxane,
octaphenylcyclotetrasiloxane,
(acetoxyethyl)heptamethylcylcotetrasiloxane, or
tetrakis(diphenylphosphinoethyl)tetramethylcylcotetrasiloxane, or any combination thereof.

13. The method of claim 1, wherein said treating compound comprises an aryl siloxane comprising:
1,1,3,3-tetraphenyldimethyldisiloxane,
1,1,3,5,5-pentaphenyl-1,3,5-trimethyltrisiloxane,
1,1,5,5-tetraphenyl-1,3,3,5-tetramethyltrisiloxane,
1,3-dichloro-1,3-diphenyl-1,3-dimethyldisiloxane,
1,3-dichlorotetraphenyldisiloxane,
1,3-diphenyl-1,1,3,3-tetrakis(dimethylsiloxy)disiloxane,
1,3-diphenyl-1,1,3,3-tetramethyldisiloxane,
1,3-divinyl-1,3-diphenyl-1,3-dimethyldisiloxane,
1,4-bis(trimethoxysilylethyl)benzene,
1,5-bis(glycidoxypropyl)-3-phenyl-1,1,3,5,5-pentamethyltrisiloxane,
1,5-divinyl-3,3-diphenyl-1,1,5,5-tetramethyltrisiloxane,
1,5-divinyl-3-phenylpentamethyltrisiloxane,
3,5-diphenyloctamethyltetrasiloxane,
3-phenyl-1,1,3,5,5-pentamethyltrisiloxane,
3-phenylheptamethyltrisiloxane,
bis(m-allylphenyldimethylsilyloctyl)-tetramethyldisiloxane,
bis(pentafluorophenyldimethoxysilane,
divinyltetraphenyldisiloxane,
hexaphenyldisiloxane,
hexaphenylcyclotrisiloxane,
1,3-bis[acrylomethyl)phenethyl]tetramethyldisiloxane,
octaphenylcyclotetrasiloxane,
(acetoxyethyl)heptamethylcylcotetrasiloxane, or
tetrakis(diphenylphosphinoethyl)tetramethylcylcotetrasiloxane, or any combination thereof.

14. The method of claim 1, wherein said treating compound comprises an acyl siloxane comprising:
1,1,1,3,3-pentamethyl-3-acetoxydisiloxane,
1,3-bis(3-carboxypropyl)tetramethyldisiloxane,
1,3-bis(3-methacryloxypropyl)tetrakis(trimethylsiloxy) disiloxane,
1,3-bis(3-methacryloxypropyl)tetramethyldisiloxane,
11-acetoxyundecyltrichlorosilane,
2-[acetoxy(polyethyleneoxy)propyl]heptamethyltrisiloxane,
methacryloxypropylpentamethyldisiloxane, or
1,3-bis[acrylomethyl)phenethyl]tetramethyldisiloxane, or any combination thereof.

15. The method of claim 1, wherein said treating compound comprises an halo siloxane comprising: hexachlorodisiloxane, or octachlorotrisiloxane, or any combination thereof.

16. The method of claim 1, wherein said treating compound comprises a polysilsesquioxane (PSS) comprising:
octamethyl silsesquioxane,
decamethyl silsesquioxane,
octavinyl silsesquioxane,
decavinyl silsesquioxane,
octamethoxy silsesquioxane,
decamethoxy silsesquioxane, or
chloropropylisobutyl-PSS, or any combination thereof.

17. The method of claim 1, further comprising:
exposing said dielectric film on said one or more substrates to at least one of a nitrogen containing material or a chlorine containing material during said performing said chemical treatment process.

18. The method of claim 3, wherein said another treating compound comprises a compound containing $C_xH_y$, wherein x and y represent integers greater than or equal to unity.

19. The method of claim 3, wherein said another treating compound comprises an alkyl silane, an alkoxysilane, an alkyl siloxane, an alkoxysiloxane, an aryl silane, an acyl silane, a cyclo siloxane, a polysilsesquioxane (PSS), an aryl siloxane, an acyl siloxane, or a halo siloxane, or any combination thereof.

20. The method of claim 3, wherein said another treating compound comprises an alkyl silane comprising:
hexamethyldisilazane (HMDS),
tetramethyldisilazane (TMDS),
trimethylsilyldimethylamine (TMSDMA),
trimethylsilyldiethylamine (TMSDEA),
N-trimethylsilyl-imidazole (TMSI),
methyltrimethoxysilane (MTMOS),
vinyltrimethoxysilane (VTMOS), trimethyichlorosilane (TMCS),
dimethylsilyldimethylamine (DMSDMA),
dimethylsilyldiethylamine (DMSDEA),
bis(dimethylamino)methyl silane (B[DMA]MS),
bis(dimethylamino)dimethyl silane (B[DMA]DS),
dimethylaminopentamethyldisilane (DMAPMDS),
dimethylaminodimethyldisilane (DMADMDS),
disila-aza-cyclopentane (TDACP),
disila-oza-cyclopentane (TDOCP),
triethyichlorosilane (TECS),
tetramethoxysilane (TMOS),
dimethyldimethoxysilane (DMDMOS),
tetraethoxysilane (TEOS),
methyltriethoxysilane (MTEOS),
dimethyldiethoxysilane (DMDEOS),
vinyltriethoxysilane (VTEOS),
trimethylmethoxysilane (TMMS),
trimethylethoxysilane (TMES),
trimethylsilanol (TMS-OH),
bis(trimethoxysilyl)hexane,
bis(trimethoxysilyl)octane,
bis(trimethylsilylmethyl)dimethoxysilane,
bistrimethoxysilylethane,
cyclohexylmethyldimethoxysilane,
cyclohexyltrimethoxysilane,
dicyclopentyldimethoxysilane,
diisobutyldimethoxysilane,
diisopropyldimethoxysilane,
dimethyldimethoxysilane,
hexadecyltrimethoxysilane,
octyldimethylmethoxysilane,
trimethoxysilane,
trimethylmethoxysilane, or
tris(dimethylsiloxy)ethoxysilane, or any combination thereof.

21. The method of claim 3, wherein said another treating compound comprises an alkyl siloxane comprising:
(3-glycidoxypropyl) pentamethyldisiloxane,
1,1,1,3,3,5,5-heptamethyltrisiloxane,
1,1,1,5,5,5-hexamethyltrisiloxane,
1,1,3,3,5,5,7,7-octamethyltetrasiloxane,
1,1,3,3,5,5-hexamethyltrisiloxane,
1,1,3,3-tetracyclopentyldichlorodisiloxane,
1,1,3,3-tetraethoxy-1,3-dimethyldisiloxane,
1,1,3,3-tetraisopropyl-1,3-dichlorodisiloxane,
1,1,3,3-tetraisopropyldisiloxane,
1,1,3,3-tetramethyl-1,3-diethoxydisiloxane,
1,1,3,3-tetramethyldisiloxane,
1,3-bis(2-aminoethylaminomethyl)tetramethyldisiloxane,
1,3-bis(3-aminopropyl)tetramethyldisiloxane,
1,3-bis(chloromethyl)-1,1,3,3-tetrakis(trimethylsiloxy) disiloxane,
1,3-bis(chloropropyl)tetramethyldisiloxane,
1,3-bis(glycidoxypropyl)tetramethyldisiloxane,
1,3-bis(hydroxybutyl)tetramethyldisiloxane,
1,3-bis(hydroxypropyl)tetramethyldisiloxane,
1,3-bis(trimethylsiloxy)-1,3-dimethyldisiloxane,
1,3-diallyleterakis(trimethylsiloxy)disiloxane,
1,3-diallyltetramethyldisiloxane,
1,3-dichlorotetramethyldisiloxane,
1,3-diethyltetramethyldisiloxane,
1,3-diethynyltetramethyldisiloxane,
1,3-dimethyltetramethoxydisiloxane,
1,3-dioctyltetramethyldisiloxane,
1,3-divinyl-1,3-dimethyl-1,3-dichlorodisiloxane,
1,3-divinyltetraethoxydisiloxane,
1,3-divinyltetramethyldisiloxane,
1,5-dichlorohexamethyltrisiloxane,
1,5-divinylhexamethyltrisiloxane,
1,7-dichlorooctamethyltetrasiloxane,
1-allyl-1,1,3,3-tetramethyldisiloxane,
2-[methoxy(polyethyleneoxy)propyl]heptamethyltrisiloxane,
3,5-bis(chloromethyl)octamethyltetrasiloxane,
3-[hydroxy(polyethyleneoxy)propyl]heptamethyltrisiloxane,
3-aminopropylpentamethyldisiloxane,
3-chloromethylheptamethyltrisiloxane,
3-octylheptamethyltrisiloxane,
bis(3-chloroisobutyl)tetramethyldisiloxane,
bis(chloromethyl)tetramethyldisiloxane,
bis(cyanopropyl)tetramethyldisiloxane,
bis(tridecafluoro-1,1,2,2-tetrahydrooctyl)tetramethyldisiloxane, bis(trifluoropropyl)tetramethyldisiloxane,
bis[(biscycloheptenyl)ethyl]tetramethyldisiloxane,
bis-2-[3,4-(epoxycylcohexyl)ethyl]tetramethyldisiloxane,
chloromethylpentamethyldisiloxane,
decamethylcyclopentasiloxane,
decamethyltetrasiloxane,
divinyletrakis(trimethylsiloxy)disiloxane,
dodecamethylcyclohexasiloxane,
dodecamethylpentasiloxane,
hexaethyldisiloxane,
hexamethyldisiloxane,
hexavinyldisiloxane,
octamethyltrisiloxane,
pentamethyldisiloxane, or
tetradecamethyhexasiloxane, or any combination thereof.

22. The method of claim 3 wherein said another treating compound comprises an aryl silane comprising:
benzyltriethoxysilane,
di(p-tolyl)dimethoxysilane,
diphenyldiethoxysilane,
diphenyldihydroxysilane,
diphenyldimethoxysilane,
diphenylmethylethoxysilane,
p-bis(trimethoxysilylmethyl)benzene,
phenyldimethylethoxysilane,
t-butyldiphenylmethoxysilane,
triphenylethoxysilane,
triphenylsilanol,
vinyldiphenylethoxysilane,
dibenzyloxydiacetoxysilane,
phenylacetoxytrimethylsilane,
phenyldimethylacetoxysilane, or
phenyltriacetoxysilane, or any combination thereof.

23. The method of claim 3, wherein said another treating compound comprises an acyl silane comprising:
bistrimethylsilyl urea (BTSU),
bis(trimethylsilyl)acetamide (BSA),
bis(trimethylsilyl)trifluoromethylacetamide (BSTFA),
triacetylvinylsilane (TAVS),
N-methyl-N-trimethylsilyl-trifluoroacetamide (MSTFA),
N-methyl-N-tert-butyldimethylsilyl-trifluoroacetamide (MBDSTFA),
N-methyl-N-trimethylsilyl-heptafluorobutyramide (MSHFBA),
acetoxytrimethylsilane (TMAS),
3-trifluoroacetoxypropyltrimethoxysilane,
acetoxyethyldimethylchlorosilane,
acetoxyethylmethyldichlorosilane,
acetoxyethyltriclorosilane,
acetoxyethyltriethoxysilane,
acetoxyethyltrimethoxysilane, acetoxymethyldimethylacetoxysilane,
acetoxymethyltriethoxysilane,
acetoxymethyltrimethoxysilane,
acetoxymethyltrimethylsilane,
acetoxypropylmethyldichlorosilane,
dimethyldiacetoxysilane,
di-t-butyldiacetoxysilane,
ethyltriacetoxysilane,
methyltriacetoxysilane,
tetraacetoxysilane,
tetrakis(trifluoroacetoxy)silane,
triethylacetoxysilane,
vinylmethyldiacetoxysilane,
vinyltriacetoxysilane,
dibenzyloxydiacetoxysilane,
phenylacetoxytrimethylsilane,
phenyldimethylacetoxysilane, or
phenyltriacetoxysilane, or any combination thereof.

24. The method of claim 3, wherein said another treating compound comprises an cyclo siloxane comprising:
1,3,5,7-tetramethylcyclotetrasiloxane,
heptamethylcyclotetrasiloxane,
hexaethylcyclotrisiloxane,
hexamethylcyclotrisiloxane,
octamethylcyclotetrasiloxane,
pentamethylcyclopentasiloxane,
pentavinylpentamethylcyclopentasiloxane,
tetraethylcyclotetrasiloxane,
hexaphenylcyclotrisiloxane,
octaphenylcyclotetrasiloxane,
(acetoxyethyl)heptamethylcylcotetrasiloxane, or
tetrakis(diphenylphosphinoethyl)tetramethylcylcotetrasiloxane, or any combination thereof.

25. The method of claim 3, wherein said another treating compound comprises an aryl siloxane comprising:
1,1,3,3-tetraphenyldimethyldisiloxane,
1,1,3,5,5-pentaphenyl-1,3,5-trimethyltrisiloxane,
1,1,5,5-tetraphenyl-1,3,3,5-tetramethyltrisiloxane,
1,3-dichloro-1,3-diphenyl-1,3-dimethyldisiloxane,
1,3-dichlorotetraphenyldisiloxane,
1,3-diphenyl-1,1,3,3-tetrakis(dimethylsiloxy)disiloxane,
1,3-diphenyl-1,1,3,3-tetramethyldisiloxane,
1,3-divinyl-1,3-diphenyl-1,3-dimethyldisiloxane,
1,4-bis(trimethoxysilylethyl)benzene,
1,5-bis(glycidoxypropyl)-3-phenyl-1,1,3,5,5-pentamethyltrisiloxane,
1,5-divinyl-3,3-diphenyl-1,1,5,5-tetramethyltrisiloxane,
1,5-divinyl-3-phenylpentamethyltrisiloxane,
3,5-diphenyloctamethyltetrasiloxane,
3-phenyl-1,1,3,5,5-pentamethyltrisiloxane,
3-phenylheptamethyltrisiloxane,
bis(m-allylphenyldimethylsilyloctyl)-tetramethyldisiloxane,
bis(pentafluorophenyldimethoxysilane,
divinyltetraphenyldisiloxane,
hexaphenyldisiloxane,
hexaphenylcyclotrisiloxane,
1,3-bis[acrylomethyl)phenethyl]tetramethyldisiloxane,
octaphenylcyclotetrasiloxane,
(acetoxyethyl)heptamethylcylcotetrasiloxane, or
tetrakis(diphenylphosphinoethyl)tetramethylcylcotetrasiloxane, or any combination thereof.

26. The method of claim 3, wherein said another treating compound comprises an acyl siloxane comprising:
1,1,1,3,3-pentamethyl-3-acetoxydisiloxane,
1,3-bis(3-carboxypropyl)tetramethyldisiloxane,
1,3-bis(3-methacryloxypropyl)tetrakis(trimethylsiloxy)disiloxane,
1,3-bis(3-methacryloxypropyl)tetramethyldisiloxane,
11-acetoxyundecyltrichlorosilane,
2-[acetoxy(polyethyleneoxy)propyl]heptamethyltrisiloxane,
methacryloxypropylpentamethyldisiloxane, or
1,3-bis[acrylomethyl)phenethyl]tetramethyldisiloxane, or any combination thereof.

27. The method of claim 3, wherein said another treating compound comprises an halo siloxane comprising:
hexachlorodisiloxane, or
octachlorotrisiloxane, or any combination thereof.

28. The method of claim 3, wherein said another treating compound comprises a polysilsesquioxane (PSS) comprising:
octamethyl silsesquioxane,
decamethyl silsesquioxane,
octavinyl silsesquioxane,
decavinyl silsesquioxane,
octamethoxy silsesquioxane,
decamethoxy silsesquioxane, or
chloropropylisobutyl-PSS, or any combination thereof.

29. The method of claim 3, further comprising:
exposing said dielectric film on said one or more substrates to at least one of a nitrogen containing material or a chlorine containing material during said performing said plasma assisted chemical treatment process.

30. The method of claim 1, wherein said dielectric film comprises a dielectric film having an initial dielectric constant ranging from 1.6 to 2.7.

31. The method of claim 1, wherein said dielectric film comprises at least one of a porous dielectric film, and a non-porous dielectric film.

32. The method of claim 31, wherein said porous dielectric film comprises at least one of a single-phase material, and a dual-phase material.

33. The method of claim 1, wherein said dielectric film comprises a film including at least one of an organic material, and an inorganic material.

34. The method of claim 1, wherein said dielectric film comprises a film including an inorganic-organic hybrid material.

35. The method of claim 1, wherein said dielectric film comprises exposing a film including an oxidized organo silane.

36. The method of claim 1, wherein said dielectric film comprises a film including at least one of hydrogen silsesquioxane, and methyl silsesquioxane.

37. The method of claim 1, wherein said dielectric film comprises a film including a silicate-based material.

38. The method of claim 1, wherein said dielectric film comprises a collective film including silicon, carbon, and oxygen.

39. The method of claim 38, wherein said collective film further comprises hydrogen in said collective film.

40. The method of claim 1, further comprising:
performing at least one of an etching process, an ashing process, or a wet cleaning process preceding said performing said thermal treatment process.

41. The method of claim 1, further comprising:
depositing a thin film following said performing said chemical treatment process.

42. The method of claim 3, further comprising:
depositing a thin film following said performing said plasma assisted chemical treatment process.

43. The method of claim 41, wherein said depositing said thin film comprises depositing a barrier layer on said dielectric film for a metallization process.

44. The method of claim 42, wherein said depositing said thin film comprises depositing a barrier layer on said dielectric film for a metallization process.

45. The method of claim 1, further comprising:
performing a plasma assisted chemical treatment process on said one or more substrates, comprising:
introducing another treating compound to said dielectric film on said one or more substrates,
forming plasma within said process chamber in order to produce fragmented constituents of said another treating compound, and
heating said one or more substrates.

46. The method of claim 1, wherein said introducing a treating compound comprises introducing the treating compound in vapor phase.

47. A computer readable medium containing program instructions for execution on a computer system, which when executed by the computer system, cause the computer system to perform the steps of:
disposing said one or more substrates in a process chamber configured to perform plural treatment processes on a dielectric film formed on at least one of said one or more substrates, wherein said dielectric film comprises an initial dielectric constant having a value less than the dielectric constant of $SiO_2$;
performing a thermal treatment process that includes annealing said one or more substrates in order to remove volatile constituents from said dielectric film on said one or more substrates; and
after performing the thermal treatment process, performing a chemical treatment process on said one or more substrates, comprising:
introducing a treating compound to said dielectric film on said one or more substrates, and
heating said one or more substrates, wherein said performing a thermal treatment process comprises increasing the percentage of silanol groups that are replaced with silyl groups on a surface of the dielectric film on the one or more substrates.

48. A method of treating a dielectric film on one or more substrates, comprising:
disposing said one or more substrates in a process chamber configured to perform plural treatment processes on a dielectric film formed on at least one of said one or more substrates, wherein said dielectric film comprises an initial dielectric constant having a value less than the dielectric constant of $SiO_2$;
performing a thermal treatment process that includes annealing said one or more substrates in order to remove volatile constituents from said dielectric film on said one or more substrates; and
after performing the thermal treatment process, performing a chemical treatment process on said one or more substrates, comprising:
introducing a treating compound to said dielectric film on said one or more substrates, and
heating said one or more substrates,
wherein the introducing a treating compound comprises introducing a pent-valent organosilicon compound to the dielectric film on the one or more substrates.

* * * * *